(12) United States Patent
Kamel et al.

(10) Patent No.: US 11,275,396 B2
(45) Date of Patent: *Mar. 15, 2022

(54) METHOD AND APPARATUS TO ASSESS AND CONTROL ENERGY EFFICIENCY OF FAN INSTALLED IN FACILITY OF BUILDING SYSTEMS

(71) Applicant: MELROK, LLC, Reno, NV (US)

(72) Inventors: Michel Roger Kamel, Buena Park, CA (US); Paul W. Donahue, Corona Del Mar, CA (US)

(73) Assignee: MELROK, LLC, Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/773,117

(22) Filed: Jan. 27, 2020

(65) Prior Publication Data

US 2020/0393863 A1    Dec. 17, 2020

Related U.S. Application Data

(63) Continuation of application No. 15/918,170, filed on Mar. 12, 2018, now Pat. No. 10,545,525, which is a
(Continued)

(51) Int. Cl.
*G05F 1/66*     (2006.01)
*G01R 21/133*   (2006.01)
(Continued)

(52) U.S. Cl.
CPC ............ *G05F 1/66* (2013.01); *G01R 21/001* (2013.01); *G01R 21/133* (2013.01);
(Continued)

(58) Field of Classification Search
CPC ... G05F 1/66; H02J 13/00014; H02J 13/0006; H02J 2203/20; G01R 21/133;
(Continued)

(56) References Cited

U.S. PATENT DOCUMENTS 4,956,875 A   9/1990  Bernard et al.
5,274,634 A   12/1993 Baiarz
(Continued)

FOREIGN PATENT DOCUMENTS

CN    201327587 Y   10/2009
CN    201622466 U   11/2010
(Continued)

OTHER PUBLICATIONS

Restriction Requirement for U.S. Appl. No. 13/685,478 dated Mar. 24, 2016.
(Continued)

*Primary Examiner* — Ramesh B Patel
(74) *Attorney, Agent, or Firm* — Knobbe, Martens, Olson & Bear, LLP

(57) ABSTRACT

Systems and methods dynamically assess energy efficiency by obtaining a minimum energy consumption of a system, receiving in a substantially continuous way a measurement of actual energy consumption of the system, and comparing the minimum energy consumption to the measurement of actual energy consumption to calculate a substantially continuous energy performance assessment. The system further provides at least one of a theoretical minimum energy consumption based at least in part on theoretical performance limits of system components, an achievable minimum energy consumption based at least in part on specifications for high energy efficient equivalents of the system components, and the designed minimum energy consumption based at least in part on specifications for the system components.

20 Claims, 11 Drawing Sheets

Related U.S. Application Data continuation of application No. 14/248,176, filed on Apr. 8, 2014, now abandoned, which is a continuation of application No. 13/685,478, filed on Nov. 26, 2012, now Pat. No. 9,727,068.

(60) Provisional application No. 61/564,219, filed on Nov. 28, 2011.

(51) Int. Cl.
  *H02J 13/00* (2006.01)
  *G01R 21/00* (2006.01)
  *G06Q 10/06* (2012.01)
  *G06Q 30/06* (2012.01)
  *G05B 15/02* (2006.01)
  *G06Q 50/06* (2012.01)

(52) U.S. Cl.
  CPC ......... *G01R 21/1333* (2013.01); *G05B 15/02* (2013.01); *G06Q 10/06312* (2013.01); *G06Q 30/06* (2013.01); *G06Q 50/06* (2013.01); *H02J 13/0006* (2013.01); *H02J 13/00014* (2020.01); *H02J 2203/20* (2020.01); *Y02B 70/30* (2013.01); *Y02P 80/10* (2015.11); *Y02P 90/82* (2015.11); *Y02P 90/84* (2015.11); *Y02P 90/845* (2015.11); *Y04S 20/221* (2013.01); *Y04S 50/10* (2013.01)

(58) Field of Classification Search
  CPC .............. G01R 21/001; G01R 21/1333; G06Q 10/06312; G06Q 30/06; G06Q 50/06; Y02B 70/30; Y02P 80/10; Y02P 90/82; Y02P 90/845; Y02P 90/84; Y04S 50/10; Y04S 20/221
  See application file for complete search history.

(56) References Cited

U.S. PATENT DOCUMENTS

| | | | |
|---|---|---|---|
| 5,406,626 A | 4/1995 | Ryan | |
| 5,590,195 A | 12/1996 | Ryan | |
| 6,466,938 B1 | 10/2002 | Goldberg | |
| 6,487,509 B1 | 11/2002 | Aisa | |
| 6,842,706 B1 | 1/2005 | Baraty | |
| 7,225,089 B2 | 5/2007 | Culp et al. | |
| 7,239,044 B1 | 7/2007 | Atcitty et al. | |
| 7,346,463 B2 | 3/2008 | Petite et al. | |
| 7,576,688 B2 | 8/2009 | Lehtinen | |
| 7,587,481 B1 | 9/2009 | Osburn, III | |
| 7,647,516 B2 | 1/2010 | Ranganathan et al. | |
| 7,844,370 B2 | 11/2010 | Pollack et al. | |
| 8,019,697 B2 | 9/2011 | Ozog | |
| 8,063,775 B2 | 11/2011 | Reed et al. | |
| 8,103,389 B2 | 1/2012 | Golden et al. | |
| 8,103,465 B2 | 1/2012 | Brzezowski et al. | |
| 8,185,250 B2 | 5/2012 | Sato | |
| 8,190,381 B2 | 5/2012 | Spanier et al. | |
| 8,207,865 B2 | 6/2012 | Kopp et al. | |
| 8,260,469 B2 | 9/2012 | Gregory et al. | |
| 8,369,997 B2 | 2/2013 | Valin | |
| 8,401,711 B2 | 3/2013 | Prengler et al. | |
| 8,532,808 B2 | 9/2013 | Drees et al. | |
| 8,559,197 B2 | 10/2013 | Cullinane et al. | |
| 8,638,011 B2 | 1/2014 | Robinson et al. | |
| 8,645,239 B2 | 2/2014 | Swaminathan et al. | |
| 8,666,685 B2 | 3/2014 | Paik et al. | |
| 8,666,688 B2 | 3/2014 | Spanier et al. | |
| 8,676,389 B2 | 3/2014 | Golden et al. | |
| 8,700,347 B2 | 4/2014 | Spanier et al. | |
| 8,706,650 B2 | 4/2014 | Ozog | |
| 9,014,996 B2 | 4/2015 | Kamel et al. | |
| 9,026,347 B2 | 5/2015 | Gadh et al. | |
| 9,052,216 B2 | 6/2015 | Kamel et al. | |
| 9,727,068 B2 * | 8/2017 | Kamel | H02J 13/0006 |
| 9,909,901 B2 * | 3/2018 | Kamel | H02J 3/381 |
| 10,069,454 B2 | 9/2018 | Prengler et al. | |
| 10,228,265 B2 * | 3/2019 | Kamel | G01R 21/133 |
| 10,241,505 B2 * | 3/2019 | Cohen | G05B 23/0224 |
| 10,545,525 B2 * | 1/2020 | Kamel | G01R 21/133 |
| 10,768,015 B2 | 9/2020 | Kamel et al. | |
| 2001/0024475 A1 | 9/2001 | Kumar | |
| 2001/0038624 A1 | 11/2001 | Greenberg et al. | |
| 2002/0120439 A1 | 8/2002 | Mekuria et al. | |
| 2003/0050738 A1 | 3/2003 | Masticola et al. | |
| 2003/0158826 A1 | 8/2003 | Burke et al. | |
| 2003/0187550 A1 | 10/2003 | Wilson et al. | |
| 2003/0193405 A1 | 10/2003 | Hunt et al. | |
| 2003/0216971 A1 | 11/2003 | Sick et al. | |
| 2004/0078153 A1 * | 4/2004 | Bartone | H02J 13/00028 702/57 |
| 2004/0078293 A1 | 4/2004 | Iverson et al. | |
| 2004/0117330 A1 * | 6/2004 | Ehlers | H04L 67/125 705/412 |
| 2005/0240427 A1 | 10/2005 | Crichlow | |
| 2006/0008085 A1 | 1/2006 | Matsuo | |
| 2006/0128374 A1 | 6/2006 | Wessel Van Rooyen | |
| 2006/0142900 A1 | 6/2006 | Rothman et al. | |
| 2006/0179313 A1 | 8/2006 | Wang | |
| 2006/0215786 A1 | 9/2006 | Nieto et al. | |
| 2007/0033642 A1 | 2/2007 | Ganesan et al. | |
| 2007/0043478 A1 * | 2/2007 | Ehlers | F24F 11/30 700/276 |
| 2007/0150452 A1 | 6/2007 | Tsurumaki et al. | |
| 2007/0194949 A1 | 8/2007 | Swarztrauber et al. | |
| 2007/0239317 A1 | 10/2007 | Bogolea et al. | |
| 2007/0246943 A1 | 10/2007 | Chang et al. | |
| 2007/0265780 A1 | 11/2007 | Kesler et al. | |
| 2008/0046387 A1 | 2/2008 | Gopal et al. | |
| 2008/0147335 A1 | 6/2008 | Adest et al. | |
| 2008/0147737 A1 | 6/2008 | Glasgow et al. | |
| 2008/0177678 A1 | 7/2008 | Di Martini et al. | |
| 2008/0272934 A1 * | 11/2008 | Wang | G08B 25/10 340/870.11 |
| 2008/0311940 A1 | 12/2008 | Uppala | |
| 2009/0012654 A1 | 1/2009 | Culp et al. | |
| 2009/0012917 A1 | 1/2009 | Thompson et al. | |
| 2009/0063859 A1 | 3/2009 | Maeda | |
| 2009/0083167 A1 | 3/2009 | Subbloie | |
| 2009/0088991 A1 | 4/2009 | Brzezowski | |
| 2009/0281677 A1 | 11/2009 | Botich et al. | |
| 2009/0307178 A1 * | 12/2009 | Kuhns | G06Q 10/06 706/54 |
| 2009/0307573 A1 | 12/2009 | Lavelle et al. | |
| 2010/0019574 A1 * | 1/2010 | Baldassarre | H02J 3/14 307/23 |
| 2010/0023174 A1 | 1/2010 | Nagata et al. | |
| 2010/0026096 A1 | 2/2010 | Yeh et al. | |
| 2010/0030391 A1 | 2/2010 | Oury et al. | |
| 2010/0063644 A1 | 3/2010 | Kansal et al. | |
| 2010/0076615 A1 * | 3/2010 | Daniel | H02J 3/28 700/293 |
| 2010/0138062 A1 | 6/2010 | Zheng et al. | |
| 2010/0138066 A1 | 6/2010 | Kong | |
| 2010/0145884 A1 | 6/2010 | Paik | |
| 2010/0217452 A1 | 8/2010 | McCord et al. | |
| 2010/0324962 A1 * | 12/2010 | Nesler | G06Q 10/0637 705/7.36 |
| 2011/0004357 A1 | 1/2011 | Mathiowetz | |
| 2011/0007824 A1 | 1/2011 | Bridges et al. | |
| 2011/0082598 A1 | 4/2011 | Boretto et al. | |
| 2011/0184574 A1 | 7/2011 | Le Roux et al. | |
| 2011/0218691 A1 | 9/2011 | O'Callaghan et al. | |
| 2011/0316559 A1 | 12/2011 | Haffner et al. | |
| 2012/0016528 A1 | 1/2012 | Raman et al. | |
| 2012/0035776 A1 | 2/2012 | Zaragoza et al. | |
| 2012/0053740 A1 | 3/2012 | Venkatakrishnan et al. | |
| 2012/0053745 A1 | 3/2012 | Ng | |
| 2012/0065796 A1 * | 3/2012 | Brian | G06Q 30/0283 700/295 |
| 2012/0078547 A1 | 3/2012 | Murdoch | |

(56) References Cited

U.S. PATENT DOCUMENTS

| | | | |
|---|---|---|---|
| 2012/0083934 A1* | 4/2012 | Jesudason | G06F 1/3203 700/291 |
| 2012/0143539 A1 | 6/2012 | Krause | |
| 2012/0158198 A1 | 6/2012 | Black et al. | |
| 2012/0173035 A1 | 7/2012 | Abe | |
| 2012/0176252 A1 | 7/2012 | Drew et al. | |
| 2012/0239214 A1 | 9/2012 | Nakashima et al. | |
| 2012/0244833 A1 | 9/2012 | Beattie, Jr. et al. | |
| 2012/0245751 A1 | 9/2012 | Gow et al. | |
| 2012/0249278 A1 | 10/2012 | Krok et al. | |
| 2012/0253539 A1 | 10/2012 | McMullin | |
| 2012/0271576 A1* | 10/2012 | Kamel | H02J 3/381 702/62 |
| 2012/0310557 A1 | 12/2012 | Bowman et al. | |
| 2012/0316691 A1 | 12/2012 | Boardman et al. | |
| 2012/0323382 A1 | 12/2012 | Kamel et al. | |
| 2013/0066482 A1 | 3/2013 | Li et al. | |
| 2013/0134780 A1 | 5/2013 | Parsonnet | |
| 2013/0134962 A1* | 5/2013 | Kamel | G06Q 10/06312 324/103 R |
| 2013/0144769 A1 | 6/2013 | Swaminathan et al. | |
| 2013/0274936 A1 | 10/2013 | Donahue et al. | |
| 2013/0344875 A1 | 12/2013 | Chowdhury | |
| 2014/0018969 A1 | 1/2014 | Forbes, Jr. | |
| 2014/0019384 A1 | 1/2014 | Hanley et al. | |
| 2014/0214220 A1 | 7/2014 | Kamel et al. | |
| 2014/0218008 A1 | 8/2014 | Ewing et al. | |
| 2014/0222231 A1 | 8/2014 | Kamel et al. | |
| 2014/0222232 A1 | 8/2014 | Kamel et al. | |
| 2014/0222486 A1* | 8/2014 | Kamel | G06Q 10/06312 705/7.22 |
| 2014/0222665 A1 | 8/2014 | Kamel et al. | |
| 2014/0229031 A1 | 8/2014 | Amarin et al. | |
| 2014/0292533 A1* | 10/2014 | Kamel | G01D 4/002 340/870.02 |
| 2014/0303935 A1 | 10/2014 | Kamel et al. | |
| 2014/0379156 A1 | 10/2014 | Kamel et al. | |
| 2014/0371935 A1 | 12/2014 | Kamel et al. | |
| 2014/0371936 A1 | 12/2014 | Kamel et al. | |
| 2015/0005968 A1 | 1/2015 | Dorough | |
| 2015/0039145 A1 | 2/2015 | Yang et al. | |
| 2015/0054339 A1 | 2/2015 | Zhao et al. | |
| 2015/0112496 A1 | 4/2015 | Fisher et al. | |
| 2015/0380937 A1 | 12/2015 | Forbes | |
| 2016/0028231 A1 | 1/2016 | Kamel et al. | |
| 2016/0033986 A1 | 2/2016 | Kamel et al. | |
| 2016/0219024 A1 | 7/2016 | Verzun et al. | |
| 2016/0323736 A1 | 11/2016 | Donahue et al. | |
| 2017/0005515 A1 | 1/2017 | Sanders et al. | |
| 2017/0302065 A1 | 10/2017 | Roldan | |
| 2020/0393863 A1 | 12/2020 | Kamel et al. | |

FOREIGN PATENT DOCUMENTS

| | | |
|---|---|---|
| CN | 101510686 B | 1/2011 |
| CN | 101976390 A | 2/2011 |
| CN | 204376420 U | 6/2015 |
| EP | 2 608 146 A1 | 6/2013 |
| JP | 11-262176 A | 9/1999 |
| JP | 2000-115162 A | 4/2000 |
| JP | 2001-312523 A | 11/2001 |
| JP | 2003-76935 A | 3/2003 |
| JP | 2003-216715 A | 7/2003 |
| JP | 2004-112371 A | 4/2004 |
| JP | 2004-350044 A | 12/2004 |
| JP | 2007-115041 A | 5/2007 |
| JP | 2008-102708 A | 5/2008 |
| JP | 2008-102709 A | 5/2008 |
| JP | 2009-070339 A | 4/2009 |
| JP | 2009-088641 A | 4/2009 |
| JP | 2010-237774 A | 10/2010 |
| JP | 2011-223841 A | 11/2011 |
| JP | 2012-044808 A | 3/2012 |
| JP | 2012-048286 A | 3/2012 |
| JP | 2013-543570 A | 12/2013 |
| KR | 10-2006-0119682 A | 11/2006 |
| KR | 10-07-01298 B1 | 3/2007 |
| KR | 20110058418 A | 6/2011 |
| WO | WO 91/13523 | 9/1991 |
| WO | WO 98/30912 A2 | 7/1998 |
| WO | WO 2010/094621 A1 | 8/2010 |
| WO | WO 2011/091444 A1 | 7/2011 |
| WO | WO 2012/145715 | 10/2012 |
| WO | WO 2012/174348 | 12/2012 |
| WO | WO 2013/081978 | 6/2013 |
| WO | WO 2016/168503 | 10/2016 |

OTHER PUBLICATIONS

Office Action for U.S. Appl. No. 13/685,478 dated Dec. 22, 2016.
Notice of Allowance for U.S. Appl. No. 13/685,478 dated May 30, 2017.
Office Action in U.S. Appl. No. 14/248,176j dated Jan. 27, 2017.
Office Action in U.S. Appl. No. 14/248,174j dated Mar. 6, 2017.
Office Action for U.S. Appl. No. 14/470,790 dated Dec. 18, 2014, 17 pages.
Office Action for U.S. Appl. No. 14/470,790 dated Feb. 25, 2016, 13 pages.
Office Action for U.S. Appl. No. 14/470,811 dated Dec. 18, 2014, 12 pages.
Office Action for U.S. Appl. No. 14/470,811 dated Mar. 3, 2016, 14 pages.
International Search Report and Written Opinion for PCT/US2012/066552, dated Mar. 25, 2013, 12 pages.
Office Action in Chinese Application No. 2012800682391 dated Oct. 27, 2016.
Office Action in Chinese Application No. 2012800682391 dated Jul. 14, 2017.
Office Action in Chinese Application No. 2012800682391 dated Nov. 17, 2017.
Office Action in Japanese Application No. 2014-544803 dated Nov. 1, 2016.
Office Action in Japanese Application No. 2014-544803 dated Jul. 25, 2017.
Notice of Allowance in Japanese Application No. 2014-544803 dated Nov. 14, 2017.
Crawley, et al., "Contrasting the capabilities of building energy performance simulation programs", Building and Environment, vol. 43, No. 4, Apr. 1, 2008, pp. 661-673.B204.
O'Sullivan, et al., "Improving building operation by tracking performance metrics throughout the building lifecycle (BLC)", Energy and Buildings, vol. 36, No. 11, Nov. 1, 2004, pp. 1075-1090.
Banerjee-R., Load Management in the Indian Power Sector Using US Experience, 1998, Elsevier Science, pp. 961-972.
Padget et al., An Agent-Based Infrastructure for Energy Profile Capture and Management, Apr. 11-13, 2011, 2011 International Conference on Networking, Sensing and Control, Delft, the Netherlands, pp. 50-55.
Anonymous, DirectBand, Wikipedia, the free encyclopedia, Feb. 13, 2012, 2 pages.
http://www.utilitydive.com/news/how-to-get-to-a-solar-based-future-according-to-mit/396080/, May 12, 2015.
Zhang et al., A Study of Aircraft Health Status Evaluation Based on Flight Data Trend Monitor, Journal of Air Force Engineering University (Natural Science Edition), vol. 5, No. 3, pp. 8-10, Jun. 30, 2004.
Restriction Requirement for U.S. Appl. No. 13/452,618 dated Jan. 15, 2015, 7 pages.
Office Action in U.S. Appl. No. 13/452,618 dated Feb. 22, 2017 in 20 pages.
Office Action in U.S. Appl. No. 13/452,618 dated Jan. 29, 2015, 12 pages.
Office Action for U.S. Appl. No. 14/307,191 dated Sep. 5, 2014, 18 pages.
Office Action for U.S. Appl. No. 14/307,191 dated Dec. 5, 2014, 13 pages.

(56) References Cited

OTHER PUBLICATIONS

Notice of Allowance for U.S. Appl. No. 14/307,191 dated Feb. 6, 2015, 10 pages.
Office Action for U.S. Appl. No. 15/875,562 dated May 31, 2018, 15 pages.
International Search Report and Written Opinion for PCT/US2012/034576, dated Nov. 14, 2012, 13 pages.
Search Report for European Application No. 12773510.8 dated Oct. 22, 2014, 9 pages.
Office Action in Chinese Application No. 201280019753.6 dated Dec. 2, 2015.
Office Action in Chinese Application No. 201280019753.6 dated Aug. 26, 2016.

* cited by examiner

800

| Total Current Energy Costs (Gas and Electric) | | 2.29 $/ft2* | |
|---|---|---|---|
| *Equivalent square footage accounts for office, data center and outdoor spaces* | | | |
| | | Low | High |
| Range of Estimated Energy Waste Annually | | 0.25 $/ft2 | 0.60 $/ft2 |
| % of Total Energy Used | | 11% | 26% |
| Annual Energy (Gas and Electric) Wasted | | $265,519 | $638,138 |
| Carbon Footprint | | | |
| Electrical Energy Carbon Footprint | | 5,735 Metric Tons of CO2 12,628,604 lb of CO2 | |
| Gas Energy Carbon Footprint | | 2,022 Metric Tons of CO2 4,453,251 lb of CO2 | |
| Total Energy Carbon Footprint | | 7,757 Metric Tons of CO2 17,081,855 lb of CO2 | |

| Ratings | Poor | Average | Good |
|---|---|---|---|
| Baseline Electric Energy Rating | | X | |
| Peak Electrical Energy Rating | X | | |
| Gas Energy Rating | X | | |
| Heating Gas Use Efficiency | X | | |
| Simultaneous Heating and Cooling | X | | |
| Nightime Power Index | | | X |
| Weekend Power Index | | | X |
| EMS Scheduling | | | X |
| Full Time Loading | | | X |

| | Existing | Better | Best |
|---|---|---|---|
| Energy Usage Targets ($/ft2) | 2.29 | 2.03 | 1.68 |
| Annual Energy Saving Target ($) | $0 | $265,519 | $638,138 |
| Carbon Reductions (tons/year) | 0 | 1,092 | 2,238 |

FIG. 8

METHOD AND APPARATUS TO ASSESS AND CONTROL ENERGY EFFICIENCY OF FAN INSTALLED IN FACILITY OF BUILDING SYSTEMS

INCORPORATION BY REFERENCE TO ANY PRIORITY APPLICATIONS

This application is a continuation of U.S. Publication Ser. No. 15/918,170, filed on Mar. 12, 2018, now U.S. Pat. No. 10,545,525, which is a continuation of U.S. application Ser. No. 14/248,176 filed on Apr. 8, 2014, which is a continuation of U.S. application Ser. No. 13/685,478, filed on Nov. 26, 2012, now U.S. Pat. No. 9,727,068, which claims the benefit of U.S. Provisional Application No. 61/564,219, filed on Nov. 28, 2011. Any and all applications for which a foreign or domestic priority claim is identified in the Application Data Sheet as filed with the present application are hereby incorporated by reference under 37 CFR 1.57.

BACKGROUND

This disclosure relates generally to evaluating energy performance of a building, a building system, and/or a collection of buildings locally or over a large geographic area.

Existing energy and greenhouse gas measurement and verification protocols rely on walk around and observe audits that are defined in, for example, International Standards Organization (ISO) 50001, American Society of Heating, Refrigerating and Air-Conditioning Engineers (ASHRAE) Level 1 audits, ASHRAE Level 2 audits, and the like. These rely on static analytics and do not produce accurate results.

Another example of existing energy protocols is the U.S. EPA's Energy Star® program. The Energy Star® program has developed energy performance rating systems for several commercial and institutional building types and manufacturing facilities. These ratings, on a scale of 1 to 100, provide a means for benchmarking the energy efficiency of specific buildings and industrial plants against the energy performance of similar facilities of the same space type, based on a national average. A rating can be generated for ratable space types based on building attributes, such as square footage, weekly operating hours, and monthly energy consumption data. The Energy Star® ratings rely on static analytics, estimates, and forecasting, and do not produce accurate results and can be difficult to verify.

As a result of the lack of accurate and consistently reliable measurement and verification standards, false claims of carbon credits, Negawatts (energy saved as a result of energy conservation or increased efficiency), and other energy reductions are being made. Further, the lack of accurate and consistent energy assessment makes it difficult to accurately determine the benefit of corrective actions to equipment and systems, to normalize energy conservation investments, to calculate paybacks from energy conservation investments and retrofits of buildings, and the like.

SUMMARY

There is a need to dynamically assess the energy sustainability of a facility, i.e., how well it is using its energy, and identify wasted energy that is consistent and accurate.

Embodiments relate to an energy search engine using dynamic analytic algorithms based at least in part on, but not limited to one or more of smart meter data, other sensor data, sub-metered energy measurement data, weather data, gas data, utility rate schedules, basic facility information, such as, for example, the direction (north, south, east or west) that the building faces, total facility square footage, occupant scheduling, facility use, and the like to dynamically assess the energy sustainability of a facility.

In accordance with various embodiments, a method to assess energy usage comprises receiving in a substantially continuous way a measurement of actual energy consumption, receiving in a substantially continuous way a measurement of ambient conditions, and comparing the measurement of actual energy consumption with a target energy consumption to calculate a substantially continuous energy performance assessment, wherein the target energy consumption is based at least in part on the measurement of ambient conditions. The method further comprising receiving in a substantially continuous way a measurement of facility occupancy and usage, wherein the target energy consumption is based at least in part on the measurement of ambient conditions and facility usage. In one embodiment, receiving in the substantially continuous way the measurement of ambient conditions comprises receiving the measurement of ambient conditions at least every 15 minutes. In one embodiment, the substantially continuous energy performance assessment comprises comparisons occurring at least every 15 minutes of the measurement of actual energy consumption with the target energy consumption.

Certain embodiments relate to a method to dynamically assess energy efficiency. The method comprises obtaining a minimum energy consumption of a system, receiving in a substantially continuous way a measurement of actual energy consumption of the system, and comparing the minimum energy consumption to the measurement of actual energy consumption to calculate a substantially continuous energy performance assessment. The system can be at least one of a building envelope, a building, a zone within a building, an energy subsystem, a facility, a group of buildings in near proximity to each other, a geographically diverse group of buildings, and the like.

In an embodiment, comparing the minimum energy consumption to the measurement of actual energy consumption comprises at least one of comparing in a substantially continuous way a theoretical minimum energy consumption of the system to the measurement of actual energy consumption to determine a theoretical energy efficiency for the system, where the theoretical minimum energy consumption is based at least in part on the theoretical performance limit of system components, comparing in a substantially continuous way an achievable minimum energy consumption of the system to the measurement of actual energy consumption to determine an achievable energy efficiency for the system, where the achievable minimum energy consumption is based at least in part on specifications for high energy efficient equivalents of the system components, and comparing in a substantially continuous way a designed minimum energy consumption of the system to the measurement of actual energy consumption to determine a designed energy efficiency for the system, where the designed minimum energy consumption is based at least in part on specifications for the system components.

Certain other embodiments relate to a method to dynamically assess energy usage. The method comprises obtaining an expected energy usage for a building having installed building systems and a load profile, receiving in a substantially continuous way measurements of actual energy consumption after an installation of at least one energy improvement measure for the building, establishing an energy usage for the building with the load profile based at least in part on the measurements received after the installation of the at least one energy improvement measure, and determining an impact of the at least one energy improvement measure. The method further comprises quantifying the effectiveness of the at least one energy improvement measure by determining at least one of a payback calculation, a payment of an incentive, a valuation of real property, and a carbon offset used in carbon trading. The installed building systems can comprise at least one of an HVAC system, a lighting system, at least one plug load, a data center system, a water heating system, and the like. Installed energy improvement measure can comprise installing a renewable energy system, retrofitting equipment, commissioning, load shifting, load shedding, installing energy storage, and the like.

According to a number of embodiments, an apparatus to dynamically assess energy usage of a system comprises computer hardware including at least one computer processor, and computer readable-storage comprising computer-readable instructions that, when executed by the computer processor, cause the computer hardware to perform operations defined by the computer-executable instructions comprising obtaining a minimum energy consumption of a system, receiving in a substantially continuous way a measurement of actual energy consumption of the system, and comparing the minimum energy consumption to the measurement of actual energy consumption to calculate a substantially continuous energy performance assessment.

The computer-executable instructions further comprise at least one of comparing in a substantially continuous way a theoretical minimum energy consumption of the system to the measurement of actual energy consumption to determine a theoretical energy efficiency for the system, where the theoretical minimum energy consumption is based at least in part on the theoretical performance limit of system components, comparing in a substantially continuous way an achievable minimum energy consumption of the system to the measurement of actual energy consumption to determine an achievable energy efficiency for the system, where the achievable minimum energy consumption is based at least in part on specifications for high energy efficient equivalents of the system components, and comparing in a substantially continuous way a designed minimum energy consumption of the system to the measurement of actual energy consumption to determine a designed energy efficiency for the system, where the designed minimum energy consumption is based at least in part on specifications for the system components.

The system can comprise at least one of a building, a building envelope, at least one building system, a zone within the building, a data center, and the like. Receiving in the substantially continuous way the measurement of actual energy consumption of the system can comprise receiving the measurement of actual energy consumption at least every 15 minutes. The substantially continuous energy performance assessment can comprise comparisons occurring at least every 15 minutes of the minimum energy consumption to the measurement of actual energy consumption and at least one of a gas energy carbon footprint, an electrical energy carbon footprint, an estimate of wasted energy, an energy rating, an energy efficiency, and a power index.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 8 is an exemplary substantially continuous energy performance assessment, according to certain embodiments.

DETAILED DESCRIPTION

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Embodiments of an energy search engine use dynamic energy related data to determine how well a facility is using energy and to identify wasted energy. Further embodiments dynamically guide building system adjustments to reduce energy waste, and verify the results of such actions. For example, contemporary heating, ventilation, and air conditioning (HVAC) systems use a combination of chilled coolant or chilled water, evaporative coils, forced air ducting, and hot water intermixed to provide comfort and fresh air to occupants of buildings. To provide this comfort, many building HVAC systems waste energy by simultaneously heating and cooling building air by relying on static factors and no external information to dynamically adjust the various HVAC components.

In one embodiment, a combination of dynamically varying factors are evaluated to dynamically adjust HVAC or other building systems for optimum occupancy comfort, lowest energy use, lowest tariff cost, and lowest GHG emissions. These factors include, but are not limited to, natural and environmental factors, occupant factors, utility tariff factors, and GHG emission factors. For example, outside temperatures near a building vary hourly throughout the workday and evening. Throughout the day, the sun heats different aspects of the building which creates a variable heating component. As occupants move in and out of rooms and in and out of the building during the workday, their heat load contribution, fresh air requirements, occupant comfort requirements, and energy use via lighting, computers, and other office equipment or industrial processes in the building vary.

The energy search engine incorporates at least one of these dynamic variables in energy modeling algorithms to provide, for example, one or more of benchmarking energy use, comparing required energy use and costs to wasted energy use and costs, dynamically guiding building system adjustments, verifying the results of such actions, and determining an optimum size of alternate electric energy systems, such as solar, wind, fuel cells, and the like to generate energy for the building.

Figure 1:
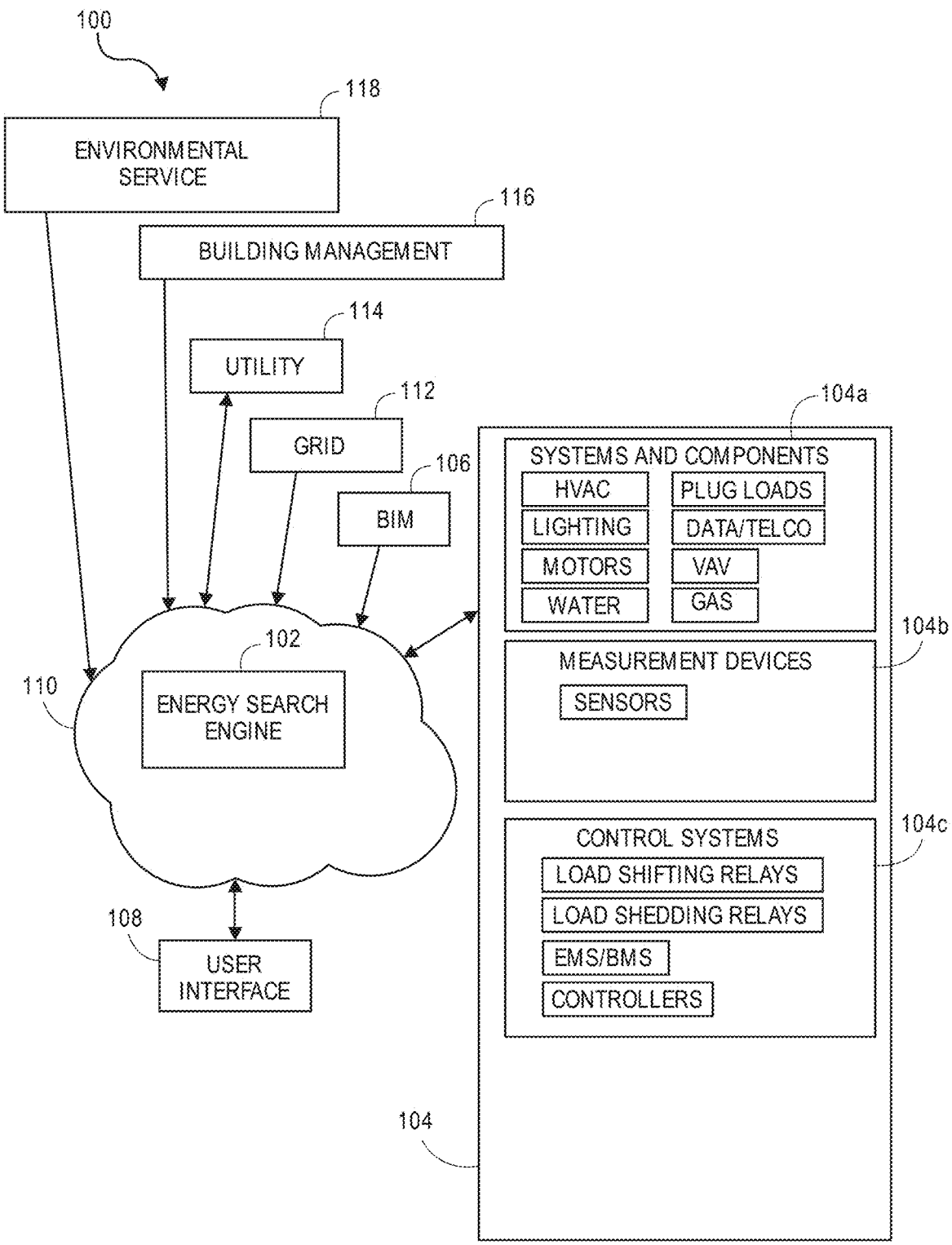
FIG. 1 illustrates a schematic diagram of a system to assess and optimize energy usage for a facility, according to certain embodiments.

FIG. 1 illustrates an exemplary schematic diagram of a system 100 to dynamically assess and optimize energy usage for an energy subsystem of a facility, the facility or a network of facilities 104. Facilities 104 can comprise one or more buildings, residences, factories, stores, commercial facilities, industrial facilities, data centers and the like, one or more rooms, one or more offices, one or more zoned areas in a facility, one or more floors in a building, parking structures, stadiums, theatres, and the like, one or more systems, subsystems, and/or components 104a, a zone within the building/facility 104, a building envelope, and the like, locally or geographically remote.

The network of facilities 104 can comprise, for example, a geographic area, facility owner, property manager, campus, weather pattern, climate zone, facility activity type, facility total square footage, facility occupied square footage, volume of facility free space, facility schedule, facility activity levels (e.g. production quantities, number of students, etc.), utility company, applicable utility rate schedule, source of energy, type and size of local generation systems, type and size of local alternative energy systems (e.g. thermal solar, thermal storage, energy storage, etc.), type of construction material used, type of energy systems used, model of energy systems used, facility design specifications, required air changes, measured air changes, type of energy management system installed, model of energy management system installed, performance of any existing energy management system, applicable energy codes, applicable energy regulations, applicable energy standards, applicable greenhouse gas emissions codes, applicable greenhouse gas emissions regulations, applicable greenhouse gas emissions standards, energy service company servicing the facility, energy consulting firm servicing the facility, and the like.

Examples of the systems, subsystems and/or components 104a include but are not limited to fans, pumps, motors, chillers, lights, heaters, heat exchangers, blowers, electric valves, air conditioning equipment, compressors, heat pumps, HVAC systems, lighting systems, motors, water heating systems, plug loads, data/Telco, variable air volume devices (VAV), gas systems, electrical systems, mechanical systems, electromechanical systems, electronic systems, chemical systems, and the like.

The facility 104 and/or building 104 in the following discussion refer to the facility, its systems, subsystems, components, and/or a network of facilities as described above.

Energy entering the facility 104 can be of many forms, such as, for example, thermal, mechanical, electrical, chemical, light, and the like. The most common forms are typically electricity or power, gas, thermal mass (hot or cold air, people), and solar irradiance. The electrical energy can be generated from traditional fossil fuels, or alternate forms of power generation, such as solar cells, wind turbines, fuel cells, any type of electrical energy generator, and the like. Ambient weather conditions, such as cloudy days, or time of day, such as nighttime, may be responsible for radiant energy transfer (gains or losses).

The facility 104 comprises measurement devices 104b configured to measure actual energy usage in real time. For example, sensors, such as wired and/or wireless sensors and/or sensor systems, can measure kilowatt hours and energy spikes of electrical energy used to power the lighting system, to power the air compressor in the cooling system and to heat water for lavatories, cubic feet of gas consumed by a heating or HVAC system, amount of air flow from compressors in the cooling or HVAC system, and the like. The sensors can comprise current sensors, voltage sensors, EMF sensors, touch sensors, contact closures, capacitive sensors, trip sensors, mechanical switches, torque sensors, temperature sensors, air flow sensors, gas flow sensors, water flow sensors, water sensors, accelerometers, vibration sensors, GPS, wind sensors, sun sensors, pressure sensors, light sensors, tension-meters, microphones, humidity sensors, occupancy sensors, motion sensors, laser sensors, gas sensors (CO2, CO), speed sensors (rotational, angular), pulse counters, and the like.

The facility 104 further comprises control systems, such as, for example, load shedding relays, load shifting relays, Energy Management Systems (EMS), Building Management Systems (BMS), and the like, to control energy consuming and energy saving components of the facility 104. For example, one or more controllers can raise or lower automatic blinds, shut off/reduce heating or cooling in an HVAC system in the entire or just one room of the facility 104, switch usage of electricity from conventional generation to electricity generated by alternate forms, such as wind or solar, and the like.

The system 100 comprises an energy search engine 102 and a user interface 108. In an embodiment, the energy search engine 102 is a cloud computing system based in a network 110, such as the Internet 110, as illustrated in FIG. 1.

In other embodiments, the energy search engine 102 is not a cloud computing system, but receives and transmits information through the network 110, such as the Internet 110, a wireless local network, or any other communication network. In an embodiment, the energy search engine 102 is hosted in a device located inside the facility 104. The device acquires sensor data and/or smart meter data directly from existing sensors and smart meters 104b. The device receives weather information, utility rate schedules, utility pricing information, grid usage information, BIM information, and other via RF broadcast signals. The device calculates locally the energy performance, actionable information and communicates control signals to local relays 104c, energy systems and other systems.

The user interface 108 allows a user to transmit information to the energy search engine 102 and receive information from the energy search engine 102. In an embodiment, the user interface 108 comprises a Web browser and/or an application to communicate with the energy search engine 102 within or through the Internet 110. In an embodiment, the user interface 108 is associated with a display and a user input device, such as a keyboard.

The energy search engine 102 receives energy usage information from the measurement devices 104b measuring energy usage of the systems, subsystems, and components 104c of the facility 104 in a substantially continuous way. The measurement devices 104b deliver data output that can include but is not limited to electric energy consumption data, natural or renewable gas data, air temperature data, air flow data, air quality data, building occupancy data, building zone level occupancy data, water data, environmental data, and geographic data, and the like. This data can be derived from individual circuits, critical components within the building 104 or its zones, or those systems that externally serve a building or group/network of buildings. In another embodiment, additional measurements of vibration, temperature, sound from critical motor components, and the like within buildings 104 or wherever motors are used for industrial or manufacturing processes are used to gauge the health of motor and equipment functions within the facility 104.

Further, the energy search engine 102 receives in a substantially continuous way dynamic data relating to energy usage from one or more of a Building Information Modeling (BIM) 106, a power grid 112, a utility company 114, building management 116, and an environmental service 118. For example, the BIM 106 can provide, but is not limited to specifications for the systems, subsystem, and components 104a installed in the facility 104, specifications for the systems, subsystem, and components with a higher energy rating that could have been installed in the facility 104, and the like. The power grid 112 can provide, but is not limited to a dynamic grid response to renewable energy sources, plug-ins, projected grid demand, grid load information, energy supply capacity, and the like. The utility company or other sellers of energy 114 can provide, but are not limited to utility rate tariffs, real-time energy pricing, price bids, and the like. The building management 116 can provide, but is not limited to facility and zone level scheduling of the facility 104, occupancy information, system status information (e.g. open doors, open windows, open shutters, etc.), and the like. The environmental service, such as a weather service, can provide, but is not limited to dynamic weather data for the location of the facility 104, projected weather for the location of the facility 104, sever weather alerts, geographical factors, and the like.

The energy search engine 102 analyzes the static data and the dynamic data received in the substantially continuous way and provides a substantially continuous energy assessment. Examples of the substantially continuous energy assessment include but are not limited to reports, benchmark results, energy performance assessments for the facility 104, network of facilities 104 or any of its systems, subsystems, and components 104a, site energy carbon footprint, source energy carbon footprint, source energy assessment, building and systems commissioning strategies, lighting strategies, data center and Telco strategies, water performance assessment, gas performance assessment, energy retrofit assessment, renewable energy assessment, and the like.

In an embodiment, the energy search engine 102 transmits commands to the control systems 104c to control the systems, subsystems, and components 104a to reduce or optimize the energy usage of the facility 104. In an embodiment, the energy search engine 102 controls the systems, subsystems, and components 104a in a substantially continuous way.

In an embodiment, substantially continuous comprises within a length of time or not to exceed a length of time which occurs at regular intervals. In another embodiment, data received in a substantially continuous way comprises data that is received within a definite length of time marked off by two instances. In other words, data received in a substantially continuous way is data that is received at regular time intervals, where the time interval does not exceed a pre-defined time interval. In another embodiment, the time interval is approximately within a pre-defined time interval. In another embodiment, the time interval is based at least in part on the type of information received. For example, weather can be received substantially continuously every hour, smart meter information can be received substantially continuously every 15 minutes, and grid load can be received substantially continuously every time interval which does not exceed an hour.

Further, in an embodiment, providing substantially continuous energy assessment comprises providing the energy assessment within a pre-defined time interval, not to exceed a pre-defined time interval, or the like. Further yet, controlling in a substantially continuous way to optimize energy usage comprises sending commands to the control systems 104c or the like within a pre-defined time interval. Again, the time interval is based at least in part on the specific system being controlled. For example, the energy search engine may direct the facility 104 to shed or redistribute power at an interval not to exceed 5 minutes, while directing the blinds to raise or lower at an interval not to exceed 2 hours.

In certain embodiments, substantially continuous time intervals comprise one of time intervals not to exceed 1 minute, time intervals not to exceed 5 minutes, time intervals not to exceed 15 minutes, time intervals no to exceed 1 hour, time intervals not to exceed 1 day, and time intervals not to exceed 1 week.

Figure 2:
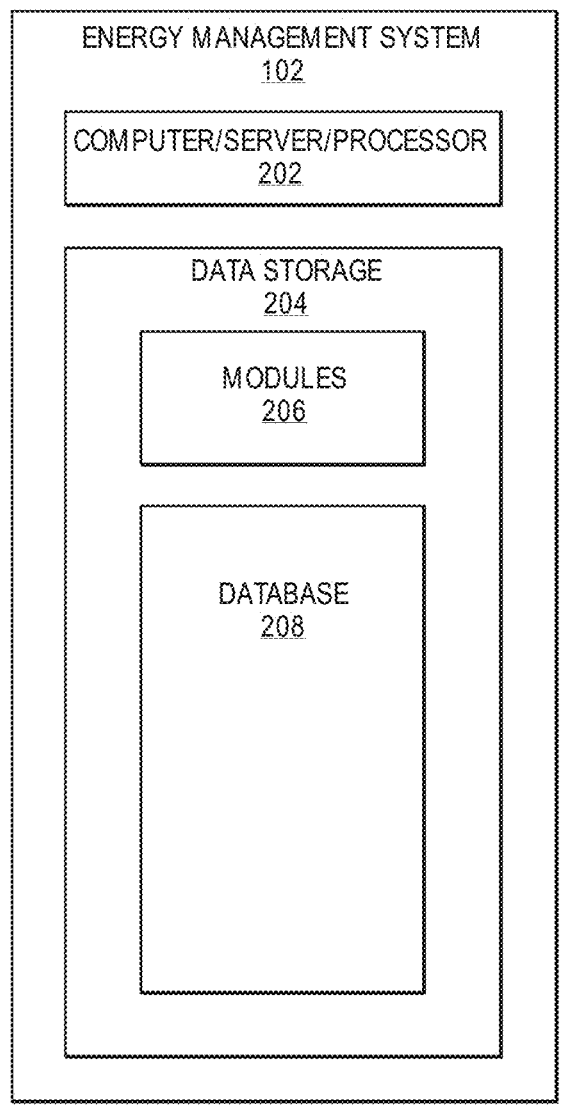
FIG. 2 illustrates an exemplary schematic diagram of an energy management system, according to certain embodiments.

FIG. 2 illustrates an exemplary block diagram of an embodiment of the energy search engine 102. The energy search engine 102 comprises one or more computers or processors 202 and memory 204. The memory 204 comprises modules 206 including computer-executable instructions, that when executed by the computer 202 cause the energy search engine 102 to analyze the energy data and provide the substantially continuous energy assessment metrics. The memory 204 further comprises data storage 208 including one or more databases to store the dynamic and or static data by the modules 206 to analyze energy usage and provide energy usage assessments.

The computers 202 comprise, by way of example, processors, Field Programmable Gate Arrays (FPGAs), System on a Chip (SOC), program logic, or other substrate configurations representing data and instructions, which operate as described herein. In other embodiments, the processors 202 can comprise controller circuitry, processor circuitry, processors, general-purpose single-chip or multi-chip microprocessors, digital signal processors, embedded microprocessors, microcontrollers and the like. The memory 204 can comprise one or more logical and/or physical data storage systems for storing data and applications used by the processor 202. The memory 204 can further comprise an interface module, such as a Graphic User Interface (GUI), or the like, to interface with the user interface 108.

In one embodiment, the energy search engine 102 calculates a score reflecting the energy performance of the facility 104. In an embodiment, the score is a weighted average of one or more metrics that are calculated based at least in part on one or more energy variables. Examples of energy variables include, but are not limited to the time history of the energy (power, water, gas) consumed by the facility, the carbon equivalent of energy used at the site, the carbon equivalent of the energy generated at the source, the time history of the ambient weather conditions, the facility activity type, the facility total square footage, the facility occupied square footage, the volume of free space in the facility, the facility schedule, the facility activity levels (e.g. production quantities, number of students, and the like), the location of the facility, the applicable utility rate schedule, the output of any existing local (or on site) generation systems, the output of any existing local alternative energy systems (e.g. thermal solar, thermal storage, energy storage, and the like), the potential for local renewable generation, the potential for local alternative energy systems, the type of construction material used, the type of energy systems used, the facility design specifications, required air change, measured air changes, the type of energy management system installed, the performance of any existing energy management system, data from any existing energy, environmental and security monitoring systems, and the like.

The facility 104 and/or building 104 and/or subsystems 104a refer to one or more of the facility, its systems, subsystems, and components, multiple buildings comprising the facility located locally or remotely, and a network of facilities in the following discussion.

In an embodiment, the score or energy metrics are calculated based on historical energy data for the past week, month, quarter, year or longer time period.

In an embodiment, data from one time period is used to backfill data missing from another time period. For example, if the data for February of 2012 is missing, then it can be backfilled using the following:

$$Y_2 = X_2/X_1 * Y_1$$

where $X_1$ is the average workday energy consumption for January 2011, $X_2$ is the average workday energy consumption for January 2012, and $Y_1$ is the 15-minute, hourly, daily, or weekly energy consumption for workdays in February 2011, and $Y_2$ is the 15-minute, hourly, daily, or weekly energy consumption for the corresponding workdays in February 2012. The above method can be used to backfill missing energy data for off days.

In another example, the same missing data for February 2012 can be backfilled using the following:

$$Y_2 = 2 * (X_1 Z_2 + Z_1 X_2)/(X_1 Z_1) * Y_1$$

where $X_1$ is the average workday energy consumption for January 2011, $X_2$ is the average workday energy consumption for January 2012, $Z_1$ is the average workday energy consumption for March 2011, $Z_2$ is the average workday energy consumption for March 2012, and $Y_1$ is the 15-minute, hourly, daily, or weekly energy consumption for workdays in February 2011, and $Y_2$ is the 15-minute, hourly, daily, or weekly energy consumption for the corresponding workdays in February 2012. The above method can be used to backfill missing energy data for off days.

In an embodiment, the energy used by the facility is calculated using the following equation:

Energy Used=Energy Sourced by the Utility+Energy Generated on Site−Energy Stored on Site where energy sourced by the utility is energy that is purchased from the utility company. The energy generated on site (locally) is energy generated by local energy generation systems as solar PV, wind turbines, fuel cells, gas power plant, etc. The energy stored on site is energy that is purchased from the utility or generated locally but is stored at the time of purchase or generation for later use in energy storage systems such as batteries, compressed air, pumped water, thermal storage, etc. If the energy storage systems are discharging, then the sign of the stored energy in the equation above is negative. Each of the components in the equation above can be measured, calculated or estimated.

In an embodiment, the energy score and metrics can be proportional to the energy performance of a facility relative in a specific time period compared to its performance in a base period. In an embodiment, the base period is one year.

In an embodiment, the metric can be proportional to the composition of source energy (solar PV, utility power, fuel cell, solar thermal, gas generator, energy storage, etc.) relative to an optimum composition of source energy for a facility, given the measured, calculated or estimated energy usage of the facility, the type of systems in the facility, the facility schedule, the facility location, the ambient weather conditions, and the like.

In an embodiment, the metrics include but are not limited to the facility electric energy use index (kwHr/ft$^2$), the facility gas use index (therms/ft$^2$), and the facility electric demand index (kw/ft$^2$).

In an embodiment, the metric can be proportional to the equivalent greenhouse gas emissions of the energy used at the facility 104, proportional to the energy generated using local renewable energy systems, proportional to the energy generated using alternative fuel systems (e.g. hydrogen fuel cells, or the like), proportional to the use of alternative energy systems, proportional to the ratio of energy used during off hours to the energy used during work hours, proportional to the ratio of energy used during work days to the energy used during off days, proportional to the minimum rate of energy consumption during a period of time (day, month, year, etc.), proportional to the simultaneous heating and cooling that may be occurring in the facility 104, or the like.

In another embodiment, the metric can be proportional to the correlation between energy used for heating energy and heating requirements, proportional to the correlation between the energy used for cooling and the cooling requirements, proportional to the estimated, calculated, or measured energy used for heating divided by the amount of heating affected, proportional to the estimated, calculated or measured energy used for cooling divided by the amount of cooling affected, and the like. Heating requirements, cooling requirements, amount of heating affected, or the amount of cooling affected can be calculated using, but not limited to one or more of the following: ambient weather, ambient environmental conditions, desired internal temperature, ventilation rates, outside air circulation, recirculation rates, recirculated air, energy consumed by loads inside the facility 104, heat generated by other sources inside the facility 104, heat entering or leaving the facility 104 through mass or thermal transfer, and the like. In one embodiment, the heating degree hours, a difference between ambient temperature and supply air temperature inside the facility for each hour, can be used as a measure of affected heating (heating kWhr/degree heated). In another embodiment, the cooling degree hours, a difference between the ambient temperature and the supply air temperature inside the facility 104 for each hour, can be used as a measure of affected cooling (cooling kWhr/degree cooled).

In another embodiment, the required heating enthalpy hours, a difference between ambient enthalpy and a target temperature and humidity inside the facility, can be used as a measure of required heating. In another embodiment, the required cooling enthalpy hours, a difference between ambient enthalpy and a target temperature and humidity inside the facility, can be used as a measure of required cooling.

In another embodiment, the affected heating enthalpy hours, a difference between ambient enthalpy and supply air enthalpy inside the facility for each hour, can be used as a measure of affected heating (heating energy kWhr/kJ heated). In another embodiment, the cooling enthalpy hours, a difference between the ambient enthalpy and the supply air temperature inside the facility 104 for each hour, can be used as a measure of affected cooling (cooling kWhr/KJ cooled).

Figure 3:
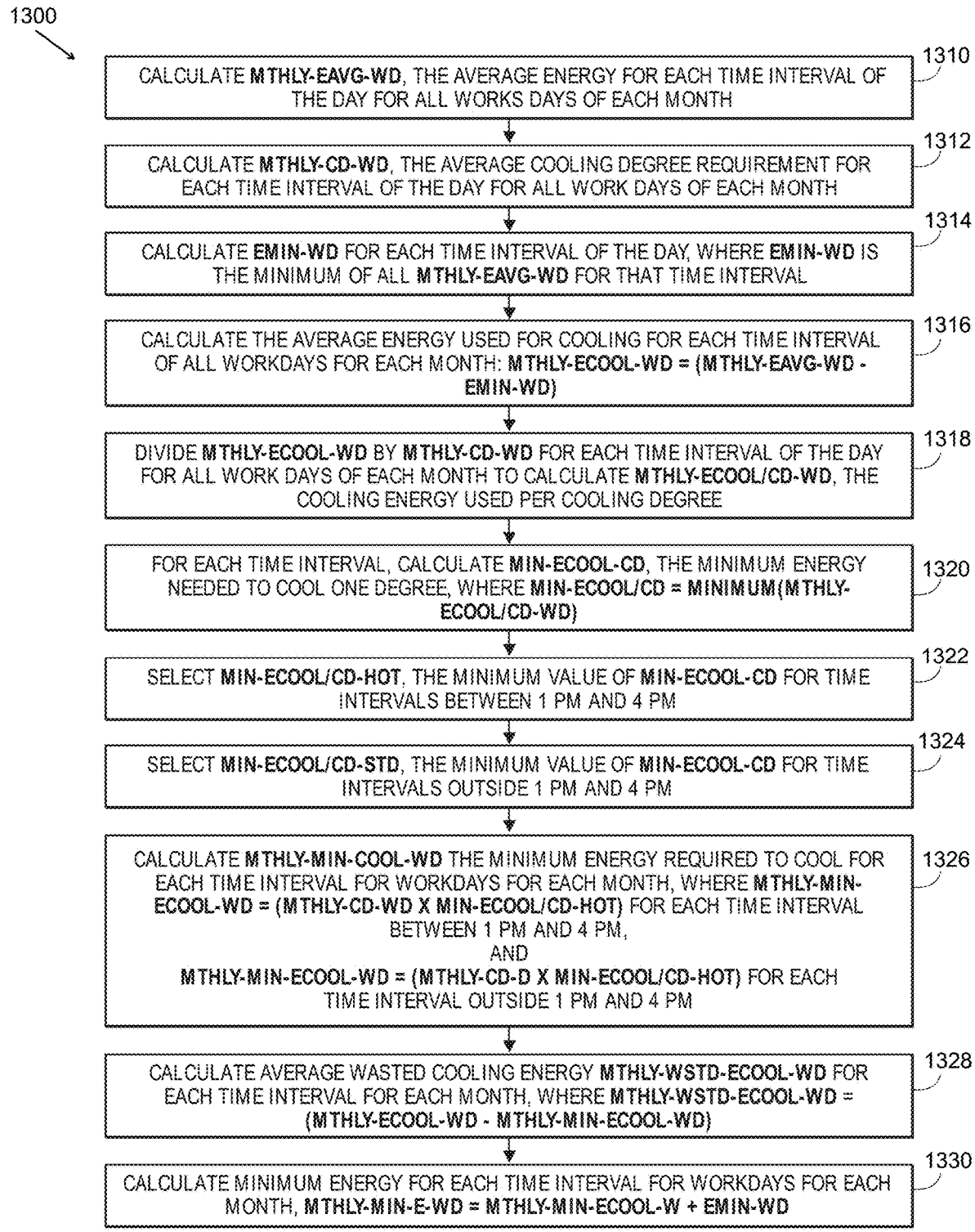
FIG. 3 is a flow chart of an exemplary energy search engine process to assess the amount of energy used for cooling and the amount of excessive cooling affected, according to certain embodiments.

FIG. 3 is a flow chart of an exemplary energy search engine process 1300 to assess the amount of energy used for cooling and the amount of excessive cooling affected. For example, the amount of energy used for cooling during workdays during a year can be estimated from the profile of total energy used during the year. The interval energy (energy consumed at regular intervals, typically 15 or 30 minutes, or any other regular interval) for a 12 month period is used. At blocks 1310 and 1312, the average energy and average cooling degree requirement, respectively, for each time interval during work days is calculated for each month.

At block 1314, the minimum energy profile for workdays in calculated and at block 1316, the average energy used for cooling is calculated as the difference between the energy profile and the minimum energy used during workdays.

At block 1318 to block 1324, the minimum energy required to cool the facility by one degree is estimated for each time interval during workdays. At block 1326, the minimum energy needed for cooling during the year is calculated from the results of blocks 1322 and 1324.

At block 1328, the amount of energy used for excessive energy, i.e. the amount of energy wasted due to excessive cooling is estimated. At block 1330, the energy profile for the year is calculated assuming the cooling and heating systems are at their peak efficiency all year long. The process can be repeated for time intervals during off-days.

Figure 4:
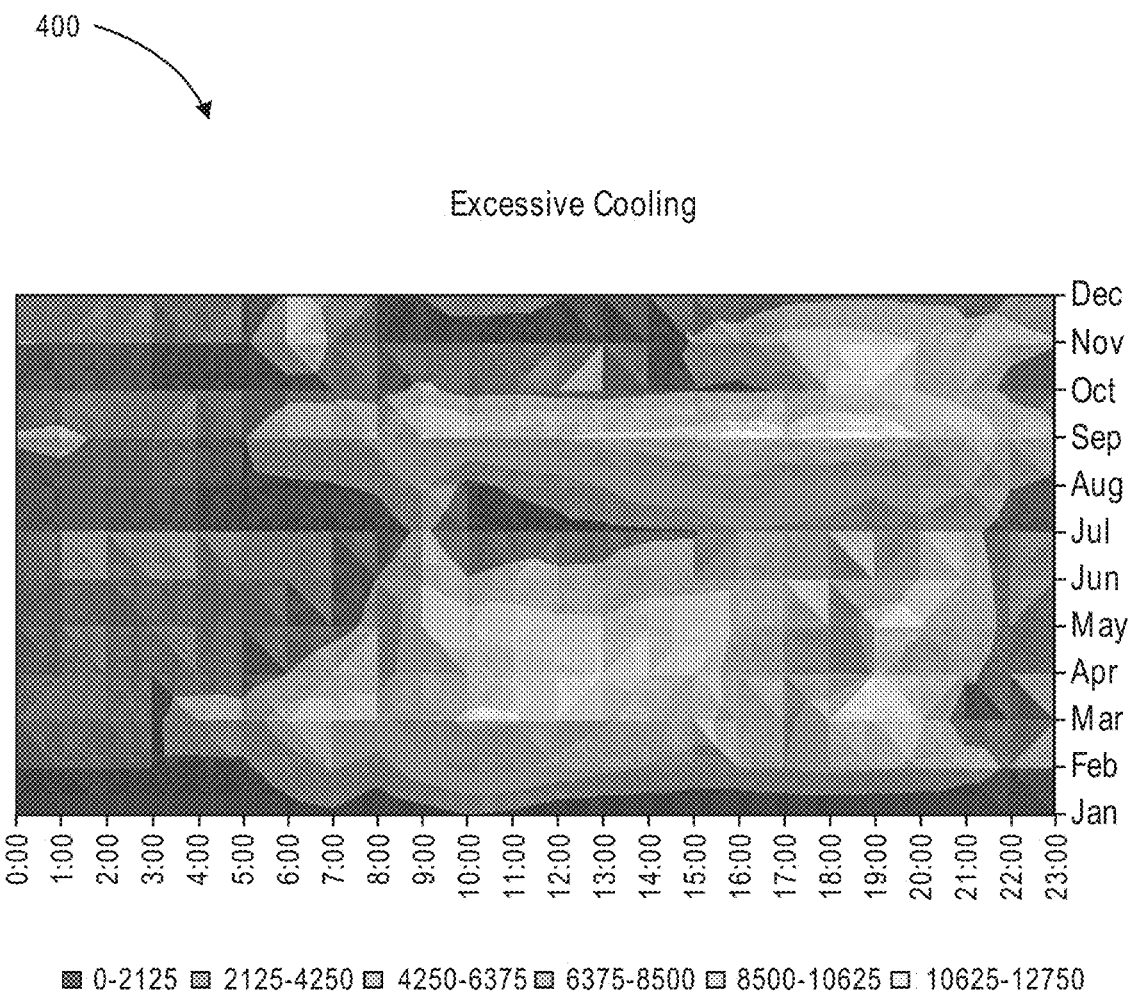
FIG. 4 is an exemplary substantially continuous excessive cooling performance assessment, according to certain embodiments.

FIG. 4 is an exemplary substantially continuous excessive cooling performance assessment 400. The performance assessment 400 is a topographical map of the facility 104 showing estimated excessive cooling energy for an average hour throughout the day in each month for a year. The excessive cooling is estimated by considering the load inside the building and the cooling requirement from the ambient weather, as described in FIG. 3. For example, the performance assessment 400 indicates total cooling costs being estimated at $117,000, with $75,000 in overcooling between 10 AM and 3 AM, and $19,000 in overcooling between 3 AM and 10 AM. Overcooling is estimated at $96,000, being up to 76% of the cooling costs. In an embodiment of the performance assessment 400, color can be used to indicate energy intensity, where brighter shades of a color indicate greater energy intensity and darker shades of the color represent lighter energy intensity (or vice versa).

In an embodiment, the metric can be proportional to the time history of the number of air changes, proportional to the fraction of outside air introduced to the facility, proportional to the fraction of return air recirculated, where return air is air that is exhausted from the facility using exhaust fans, proportional to the air quality inside the facility, proportional to facility peak demand and the load duration curve, which represents the time spent at each power level from the lowest demand to the peak demand, proportional to the level of compliance of the facility 104 or any of its subsystems 104a with one or more of existing and/or future energy regulations, standards, codes, specifications and guidelines, and the like.

In another embodiment, the metric can be proportional to the level of energy demand reduction or load shedding initiated in response to a request from the grid or utility. The energy demand reduction can be calculated relative to a baseline that is adjusted for one or more of the following factors: ambient weather conditions, ambient environment conditions, changes in facility schedule, changes in facility activity, changes in facility occupancy, and the like. In an embodiment, the projected energy demand reduction for the facility 104 can be calculated by estimating the amount of energy that will be used for cooling as described above and assuming that a certain percentage of the cooling energy will be reduced.

In a yet further embodiment, the metric can be proportional to the change in energy consumption of the facility 104 or any of its energy subsystems 104a compared to an energy baseline, an energy benchmark, a computed energy usage, an estimated energy usage or a projected energy usage.

In an embodiment, an energy baseline can be calculated for any measured or calculated metric, and correlated with ambient weather conditions, facility usage, and facility schedule. The calculated baseline can be used to project the value of the metric given projections of ambient weather conditions, facility usage, facility schedule, or changes in energy systems.

In an embodiment, the metric can be proportional to the cost of total energy used at the facility 104, proportional to the cost of gas energy used at the facility, proportional to the cost of energy used at the facility 104 from renewable energy sources, proportional to the cost of energy used at the facility 104 from alternative energy sources, proportional to the total cost to generate the energy at the source, proportional to the cost of delivering the energy from the source to the facility 104, proportional to the total cost of electric energy used at the facility 104, proportional to the peak electric energy demand costs at the facility 104, proportional to the electric energy consumption costs at the facility 104, proportional to the avoided energy consumption costs, proportional to the avoided peak demand costs, or the like.

In another embodiment, the metric can be proportional to the energy consumed in the facility 104, proportional to the total energy that can be delivered to the facility 104, proportional to the total energy that can be generated in the facility 104, proportional to the total energy that can be reduced in the facility 104, proportional to the reliability of the sources of energy to the facility 104 and the total uptime of one or more of the facility's energy sources, proportional to the power quality (e.g. power factor, total harmonic distortion, energy in harmonic frequencies, voltage spikes, voltage drops, power surges, etc.) of the power in the facility 104 or any of its energy subsystems 104a, proportional to number of megawatts (MW) or megawatt-hours (MWhr) avoided as a response to an energy emergency, or the like. An example of such avoided energy is the load shed as part of a utility's Demand Response program.

In another embodiment, any of the metrics can be calculated every year, month, week, day, hour, or in a substantially continuous manner.

In a further embodiment, any of the metrics can be calculated in the cloud-based server 102 and can be offered as a subscription-based service.

Figure 5:
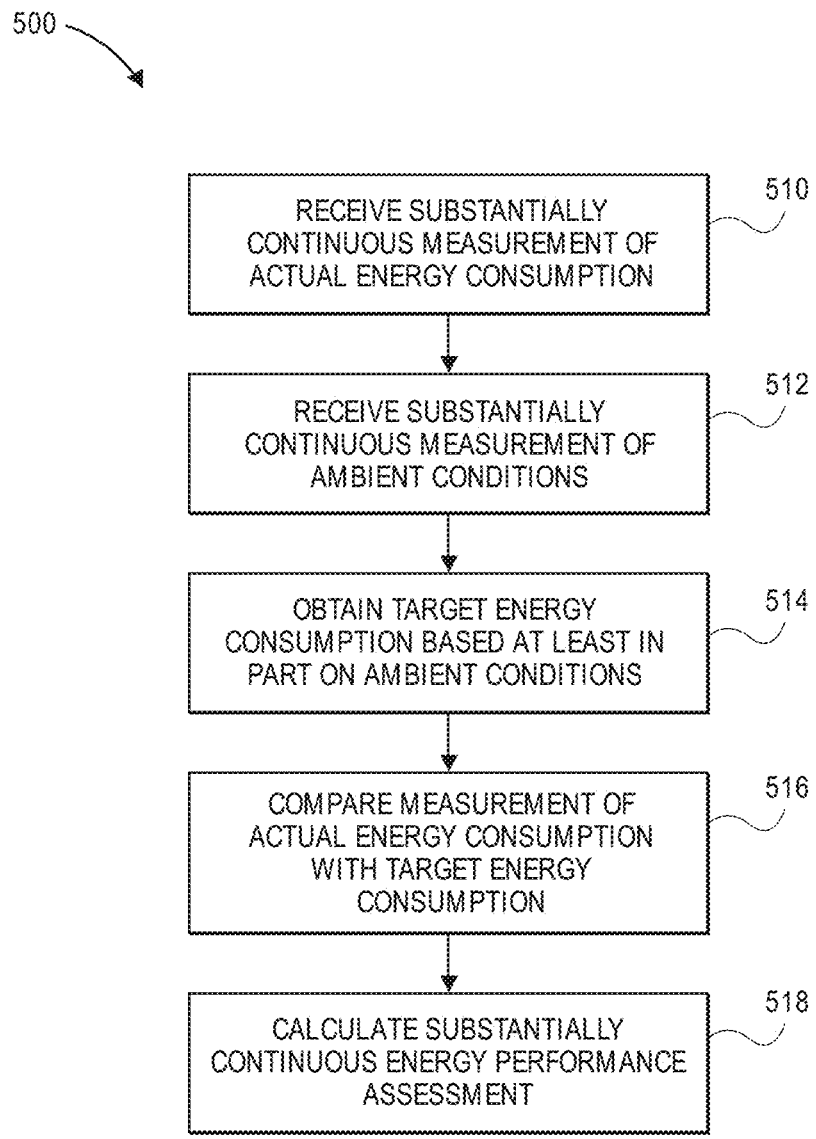
FIG. 5 is a flow chart of an exemplary energy search engine process to assess energy usage, according to certain embodiments.
Figure 6:
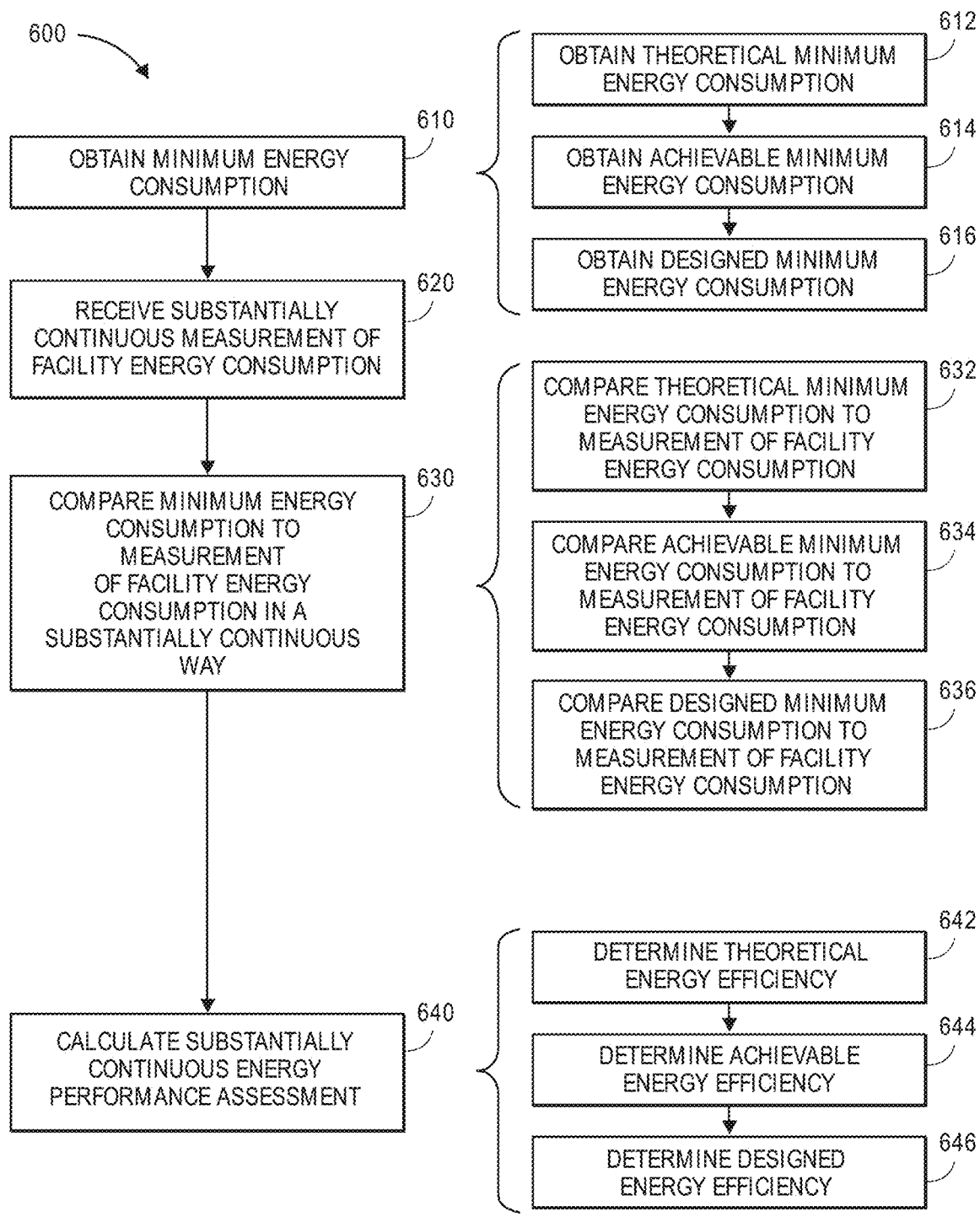
FIG. 6 is a flow chart of an exemplary energy search engine process to dynamically assess energy efficiency, according to certain embodiments
Figure 7:
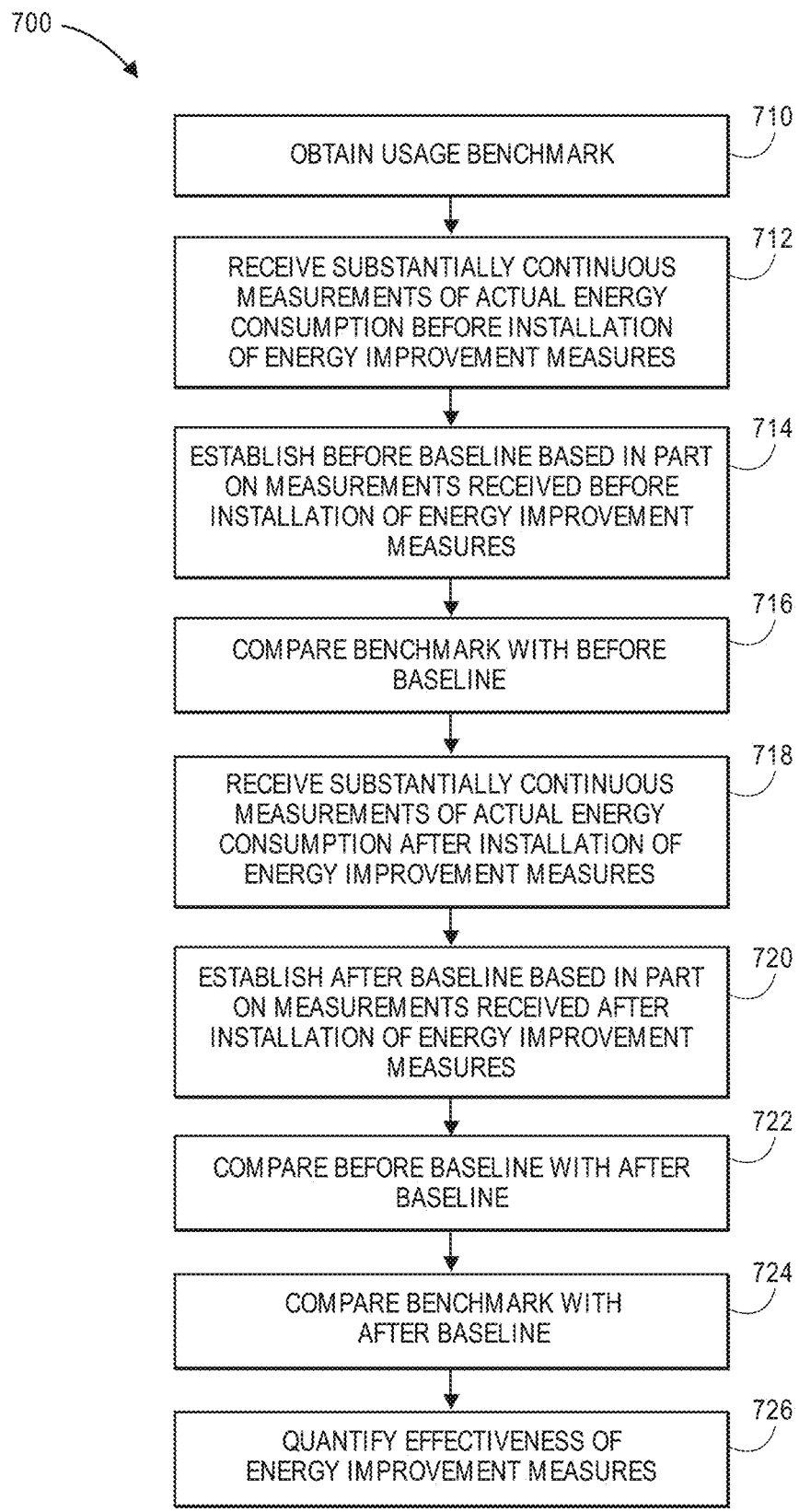
FIG. 7 is a flow chart of an exemplary energy search engine process to quantify the effectiveness of energy improving measures, according to certain embodiments.

FIGS. 5, 6, and 7 are flow charts of exemplary search engine processes to actively process energy consumption data, environmental data, and building use data, examples of which are described above, in a plurality of time frames, including real time, to provide one or more of the metrics related to the minimum energy required by the facility 104 and its critical subsystems 104a for a unique geographic location, use, environment, and occupancy associated with the facility 104, examples of which are described above.

In other embodiments, the energy search engine algorithms provide energy and sustainability ratings for commercial, municipal, campus, state, and federal buildings. Another embodiment provides carbon footprinting of buildings and facilities. Yet another embodiment evaluates the value of real property by evaluating its energy consumption and effectiveness and efficiency of installed systems and components. A further embodiment evaluates the instant demand response, load shedding, load shifting, and additional local generating potential of buildings, facilities, campuses and their systems. A yet further embodiment guides and evaluates actionable energy efficiency and demand response improvement measures, equipment retrofits, and commissioning strategies. In an embodiment, the technology enables compliance with legislated energy efficiency mandates and goals.

FIG. 5 is a flow chart of an exemplary energy search engine process 500 to assess energy usage for the facility 104. The facility 104 and/or building 104 and/or subsystem 104 refer to one or more of the facility, its systems, subsystems, and components, multiple buildings comprising the facility located locally or remotely, and a network of facilities in the following discussion. Beginning at block 510, the process 500 receives substantially continuous measurements of actual energy consumption of the facility 104. In an embodiment, the process 500 receives measurements related to the actual energy consumption of the facility 104 from the measurement devices 104b. Examples of the measurements of actual energy consumption are smart meter readings, electric meter readings, gas meter readings, current measurements, facility energy variables as described above, and the like.

In another embodiment, receiving substantially continuous measurements comprises receiving measurements at least every 15 minutes. In another embodiment, receiving substantially continuous measurements comprises receiving measurements at least every 5 minutes. In a further embodiment, receiving substantially continuous measurements comprises receiving measurements at least every 1 hour.

At block 512, the process 500 receives substantially continuous measurements of ambient conditions. For example, the energy search engine 102 can receive weather reports including the outside air temperature, outside air humidity, cloud coverage, UV index, precipitation level, evaporative transpiration (ET) number, weather forecast, and the like. In another example, the status of doors, windows, and shutters associated with the facility 104 can change with time and can be received in a substantially continuous manner.

At block 514, the process 500 obtains a target energy consumption of the facility 104 based at least in part on the ambient conditions. Target energy consumption can be a calculated energy consumption based on baseline performance, desired environmental conditions inside the facility (temperature, humidity, air quality, etc.) projected facility schedule, projected facility usage, and projected weather conditions. Average facility energy consumption at a given ambient condition and facility usage level can be calculated based on historic data. This average can be set as a target for the facility when similar weather and facility usage are anticipated.

At block 516, the process 500 compares the measurement of the actual energy consumption with the target energy consumption for the facility 104, and at block 518, the process 500 calculates a substantially continuous energy performance assessment based at least in part on the comparison of the measurement of the actual energy consumption with the target energy consumption.

Metrics found on the performance assessment can include but are not limited to one or more of total gas and electric current energy costs per square foot of the facility 104, baseline electric energy rating, peak electrical energy rating, gas energy rating, efficiency of heating gas use, simultaneous heating and cooling, nighttime power index, weekend power index, EMS scheduling, full time loading, an overall performance assessment, energy wasted annually, range of estimated energy wasted annually, cost to produce energy at the source, cost to deliver energy to the facility 104, waste as a percent of total energy used, cost of annual gas and electric energy wasted annually, electrical energy carbon footprint, gas energy carbon footprint, total energy carbon footprint, target energy usage in cost per square foot of the facility 104, annual energy savings target, historical electricity and gas usage, historical monthly peak demand for electricity, historical energy map showing annual energy usage versus the time of the day the usage occurred, wasted heating based on a comparison of heating requirements and the actual energy used for heating, simultaneous heating and cooling based on an estimated energy used for cooling during business hours and an estimated energy used for heating during business hours, wasted cooling during business hours based on a comparison of relative cooling required during business hours and an estimated energy used for cooling during business hours, wasted cooling during non-business hours based on a comparison of relative cooling required during non-business hours and an estimated energy used for cooling during non-business hours, cooling degree hours, heating degree hours, peak reduction, energy savings recommendations, energy source planning, energy source investment payback including but not limited to fuel call, grid tied solar, thermal storage, battery-based peak shedding, and utility based on electric utility data, gas utility data, National Oceanic and Atmospheric Administration (NOAA) weather data for the facility 104, and the like.

In another embodiment, the metric can be proportional to the level of compliance with one or more energy standards, such as, for example, ISO 50001, LEED Silver, LEED Gold, LEED Platinum, and the like.

In another embodiment, the metric can be proportional to the cost of bringing the facility to compliance with one or more energy standard.

In another embodiment, the metric can be proportional to the energy savings (in consumption kWhr, demand kW or energy costs $) that can be realized by bringing the facility to compliance with one or more energy standard.

In another embodiment, the metric can be proportional to the absolute efficiency of the energy subsystem or facility 104. The absolute efficiency of the energy subsystem 104 can be the ratio between the measured, calculated or estimated energy consumed by the subsystem 104 and the energy the subsystem 104 would have consumed if it operated at the theoretical limits of the subsystem 104.

In another embodiment, the metric can be proportional to the achievable efficiency of the energy subsystem or facility 104. The achievable efficiency of the energy subsystem 104 can be the ratio between the measured, calculated or estimated energy consumed by the subsystem 104 and the energy the subsystem 104 would have consumed if it operated at the highest efficiency achievable by such subsystems 104.

In an embodiment, the metric can be proportional to the design efficiency of the energy subsystem or facility 104. The design efficiency of the energy subsystem or facility 104 can be the ratio between the measured, calculated or estimated energy consumed by the subsystem 104 and the energy the subsystem 104 would have consumed if it operated per the manufacturer's design specification.

In an embodiment, the metric can be proportional to the savings realized (consumption kWHr, demand KW, energy costs in $) if one or more energy subsystems is operating at its theoretical, absolute, or design efficiency.

FIG. 6 is a flow chart of an exemplary energy search engine process 400 to dynamically assess energy efficiency for the facility 104. Energy search engine algorithms analyze measured energy data versus computed minimum required energy to provide, for example, energy efficiency ratings, energy consumption profiles, energy load factors, critical component assessment, and life cycle analysis of critical components.

Beginning at block 610, the process 600 obtains a minimum energy consumption for the facility 104.

Obtaining the minimum energy consumption at block 410 comprises obtaining the theoretical energy consumption based at least in part on models of the installed building systems, subsystems, and components 104a at block 612. In an embodiment, obtaining the minimum energy consumption comprises obtaining a theoretical energy consumption based at least in part on ideal models or the theoretical limits of the installed building systems, subsystems, and components 104a.

Obtaining the minimum energy consumption at block 610 further comprises obtaining an achievable minimum energy consumption based at least in part on specifications for high energy efficiency equivalents of the installed building systems, subsystems, and components 104a at block 614 and obtaining a designed minimum energy consumption based at least in part on specifications and cumulative loads for the installed building systems, subsystems, and components 104a at block 616.

At block 620, the process 600 receives substantially continuous measurements of the facility energy consumption. In an embodiment, the measurements are provided by the measurement devices 104b. In another embodiment, measurements are calculated. In a further embodiment, the measurements are estimated.

At block 630, the process 600 compares the minimum energy consumption to the measurement of the facility energy consumption in a substantially continuous way. Comparing at block 630 comprises comparing the theoretical minimum energy consumption to the measurement of the facility energy consumption at block 632, comparing the achievable minimum energy consumption to the measurement of the facility energy consumption at block 634, and comparing the designed minimum energy consumption to the measurement of the facility energy consumption at block 636.

At block 640, the process 600 calculates a substantially continuous energy performance assessment for the facility 104. Calculating the substantially continuous energy performance at block 640 comprises determining a theoretical energy efficiency at block 642, determining an achievable energy efficiency at block 644, and determining a designed energy efficiency at block 646.

For example, the absolute or theoretical efficiency metric for a fan can be calculated from a measurement, estimation or calculation of one or all of the following: fan upstream pressure, fan downstream pressure, flow temperature, fan speed, mass flow rate through the fan, volumetric flow rate through the fan, and/or energy consumed by the fan. The fan's absolute efficiency is then calculated by dividing the energy consumed by the energy that should have been consumed by the fan if it operated at its theoretical efficiency under the same conditions of upstream pressure, downstream pressure, fan speed, flow temperature, volumetric flow rate, or mass flow rate through the fan.

In another example, the achievable efficiency metric for a fan can be calculated from a measurement, estimation or calculation of one or all of the following: fan upstream pressure, fan downstream pressure, flow temperature, fan speed, mass flow rate through the fan, volumetric flow rate through the fan, and/or energy consumed by the fan. The fan's achievable efficiency is then calculated by dividing the energy consumed by the energy that should have been consumed by the highest performing fan available operating under the same conditions of upstream pressure, downstream pressure, fan speed, flow temperature, volumetric flow rate, or mass flow rate through the fan.

In a further example, the design efficiency metric for a fan can be calculated from a measurement, estimation or calculation of one or all of the following: fan upstream pressure, fan downstream pressure, flow temperature, fan speed, mass flow rate through the fan, volumetric flow rate through the fan, and/or energy consumed by the fan. The fan's design efficiency is then calculated by dividing the energy consumed by the energy that should have been consumed by the fan operating per the manufacturer's design specifications under the same conditions of upstream pressure, downstream pressure, fan speed, flow temperature, volumetric flow rate, or mass flow rate through the fan.

In another example, the theoretical efficiency of a facility envelope on hot days can be calculated assuming a perfectly insulated facility envelope that blocks all radiant heat transfer into the facility 104, all convective heat transfer into the facility 104, and all infiltration of mass in and out of the facility 104. The heat generated in the facility 104 is calculated from a measurement, estimate, or calculation of the energy consumed in the facility 104, such as indoor lighting, plug load, heating gas, etc., and the heat generated by occupants and processes in the facility 104. The heat removed from the facility 104 can be calculated from a measurement, estimate, or calculation of the difference between enthalpy of the ventilation and cooling air leaving the envelope and the enthalpy of the ventilation and cooling air entering the envelope. The facility 104 can be assumed to be at constant operating temperature. For a perfectly insulated envelope at a constant internal temperature, the heat removed from the facility 104 is equal to the heat generated in the facility 104. The envelope efficiency on a hot day can be calculated as the ratio of the heat generated in the facility 104 divided by the heat removed from the facility 104.

In a further example, the design efficiency of a roof top packaged HVAC unit can be calculated by measuring the enthalpy (temperature, humidity and flow rate) of the air entering the HVAC system (fraction of return air+fraction of outside air), the enthalpy of the air leaving the HVAC system (supplied to the facility 104) and the energy consumed by the HVAC system. The energy consumed by the HVAC is divided by the enthalpy of air entering the HVAC—enthalpy of air leaving the HVAC] to yield a measured coefficient of performance (COP). The measured COP is then divided by the design COP specified by the HVAC manufacturer at the given HVAC load and the resulting ratio comprises the design efficiency of the HVAC system.

FIG. 7 is a flow chart of an exemplary energy search engine process 500 for demand side analysis. In one embodiment, the energy search engine 102 matches varying demand side load requirements to supply side generating and grid capability to establish relative value energy pricing.

The exemplary process 700 quantifies the effectiveness of energy improving measures, such as rating the energy efficiency and carbon footprint of the facility 104 and/or any or all of its systems 104a (individually or collectively) to determine opportunities to introduce energy efficiency, install retrofits, commission facilities for monitoring based commissioning (MBCx), retrocommissioning (RCx), continuous commissioning, and the like, and provide peak reduction and demand response strategies and actions.

Beginning at block 710, the process 700 obtains an energy usage benchmark for the facility 104. In an embodiment, the energy usage benchmark is an energy usage point of reference across a network of facilities that share something in common against which the energy usage of the facility 104 may be compared. For example, the benchmark could be one of an Energy Star® rating, historical energy use of the facility 104, energy performance of buildings in a specific geographic area, energy performance of buildings of a certain size, energy performance of buildings of a certain activity, energy performance of buildings with a certain type of cooling technology, energy performance of buildings with a certain type of heating technology, energy performance of buildings with a certain type of construction material, energy performance of buildings with a certain brand and model of EMS, energy performance of buildings with a certain energy certification, energy performance of buildings with a certain energy rating, energy performance of buildings with a certain local energy source (e.g. solar PV), or the like.

At block 712, the process 700 receives substantially continuous measurements of actual energy consumption for the facility 104 before installation of energy improvement measures. In an embodiment, the measurements are obtained from the measurement devices 104b.

At block 714, the process 700 establishes a first baseline of energy usage for the facility 104 based at least in part on the measurements of actual energy consumption received before the installation of the energy improvement measures. In an embodiment, establishing the baseline before installation comprises obtaining an expected energy usage for the facility which has installed systems, subsystems, and components 104c, and a load profile. The baseline is established by recording the energy performance of the facility over a period of time, e.g. 3 months or 1 year. Multiple baselines can be calculated, such as for night hours on work days, morning hours on work days, afternoon hours on work days, night hours on off days, morning hours on off days, afternoon hours on off days.

Different types of baselines can be calculated, including, but not limited to total energy consumption (kWhr), electrical energy consumption (kWhr), electrical demand (kW), gas consumption (therms), energy used for lighting (kWhr), demand due to lighting (kW), energy used for cooling (kWhr), demand due to cooling (kW), and the like. Baselines can also be normalized with ambient weather conditions, cooling degree hours, heating degree hours, facility usage levels, facility occupancy, etc. For example, the baseline of energy consumed (kWhr) during morning hours on work days, could be the average consumption during morning hours for all workdays of a certain segment or entire segment of the baseline calculation period. The consumption baseline can be normalized to cooling degree hours by dividing the average consumption for each of the morning hours on work days with the average cooling degree hour for each of those hours.

At block 716, the process 700 compares the benchmark with the baseline established before the installation of the at least one energy improvement measure.

At block 718, the process 700 receives substantially continuous measurements of actual energy consumption for the facility 104 after installation of at least one energy improvement measure. In an embodiment, the measurements are obtained from the measurement devices 104b.

Examples of energy improvement measures are, but not limited to, installing a renewable energy system, retrofitting equipment, commissioning, load shifting, load shedding, installing energy storage, installing LED lighting systems, installing variable frequency drive (VFD) systems, installing new windows, installing new wall insulation, replacing inefficient boilers, upgrading the insulation of hot and cold water pipes, installing economizer systems, installing evaporative cooling systems, adding circulation fans, changing the location of supply and return ventilation air ducts, installing pool covers, installing thermal storage systems, installing shades and awnings, and the like.

At block 720, the process 700 establishes a second baseline based at least in part on the measurements of actual energy consumption received after the installation of the energy improvement measures. In an embodiment, establishing the baseline after installation comprises obtaining an energy usage for the facility which has installed systems, subsystems, and components 104c, and a load profile.

At block 722, the process 700 compares the first baseline established before installation of the at least one energy improvement measure with the baseline established after installation of the at least one energy improvement measure.

At block 724, the process 500 compares the benchmark with the baseline established after installation of the at least one energy improvement measure.

At block 726, the process 700 quantifies the effectiveness of the at least one energy improvement measure. In an embodiment, the process 700 determines the impact of the at least one energy improvement measure against the first baseline of energy usage for the facility 104. In another embodiment, the process 700 determines the impact of the at least one energy improvement measure against the benchmark for the facility 104. In an embodiment, quantifying the effectiveness of the at least one energy improvement comprises determining one or more of a payback calculation, a payment of an incentive, a valuation of real property for purposes that include projecting the value of operational strategies and behaviors or equipment replacements that result in altered real property valuations, a carbon offset used in carbon trading, and the like.

FIG. 8 is an exemplary substantially continuous energy performance assessment 800. The assessment 800 includes information about the current energy usage of the facility 104, rating of energy metrics, and targeted energy usage. For example, the metrics for current energy usage include the total gas and electric energy cost per square foot of the facility 104; low and high ranges for the annual estimated energy wasted, the percent of wasted energy out of the total energy used, the cost of the annual energy wasted; and carbon footprint metrics, such as the carbon footprint of the electrical energy used, the carbon footprint of the gas energy used, and total carbon footprint for the facility 104. Energy metrics, such as the baseline energy rating, the peak electrical energy rating, the gas energy rating, the efficiency of the gas used for heating, the occurrence of simultaneous heating and cooling, the nighttime power index, the weekend power index, the energy management system scheduling, and the full time loading levels, are rated on a poor, average or good scale. Finally, the assessment 600 includes a comparison of energy usage, energy savings, and carbon reductions for the current energy implementation of the facility with at least two suggested energy reduction implementations to provide a better target and a best target.

In an embodiment, the energy search engine 102 provides the energy performance of a network of facilities 104 on a multi-dimensional map. The multi-dimensional map plots one or more metrics on a geographical map with colors, coordinates and shapes. For example, a metric proportional to the fraction of a facility's energy demand that can be shed (reduced) at any given time can be plotted on a geographical map of the area. Every facility 104 can be indicated by a circle, with the size of the circle proportional to the levels of demand (in kW) that can be shed at each facility 104 and the color of the circle indicating the percent facility demand that can be shed. Similar maps can be used to animate the effect of a cloud passing on the potential for demand reduction across a network of facilities 104 based on demand projections calculated using the energy search engine 102.

In another example, several metrics can be plotted on a single map with every metric represented by a layer of a unique color, with the shades of each color proportional to the level of the metric (e.g. light shades of a color indicating smaller values of the metric and darker shades of the same color indicating larger values of the same metric).

Figure 9:
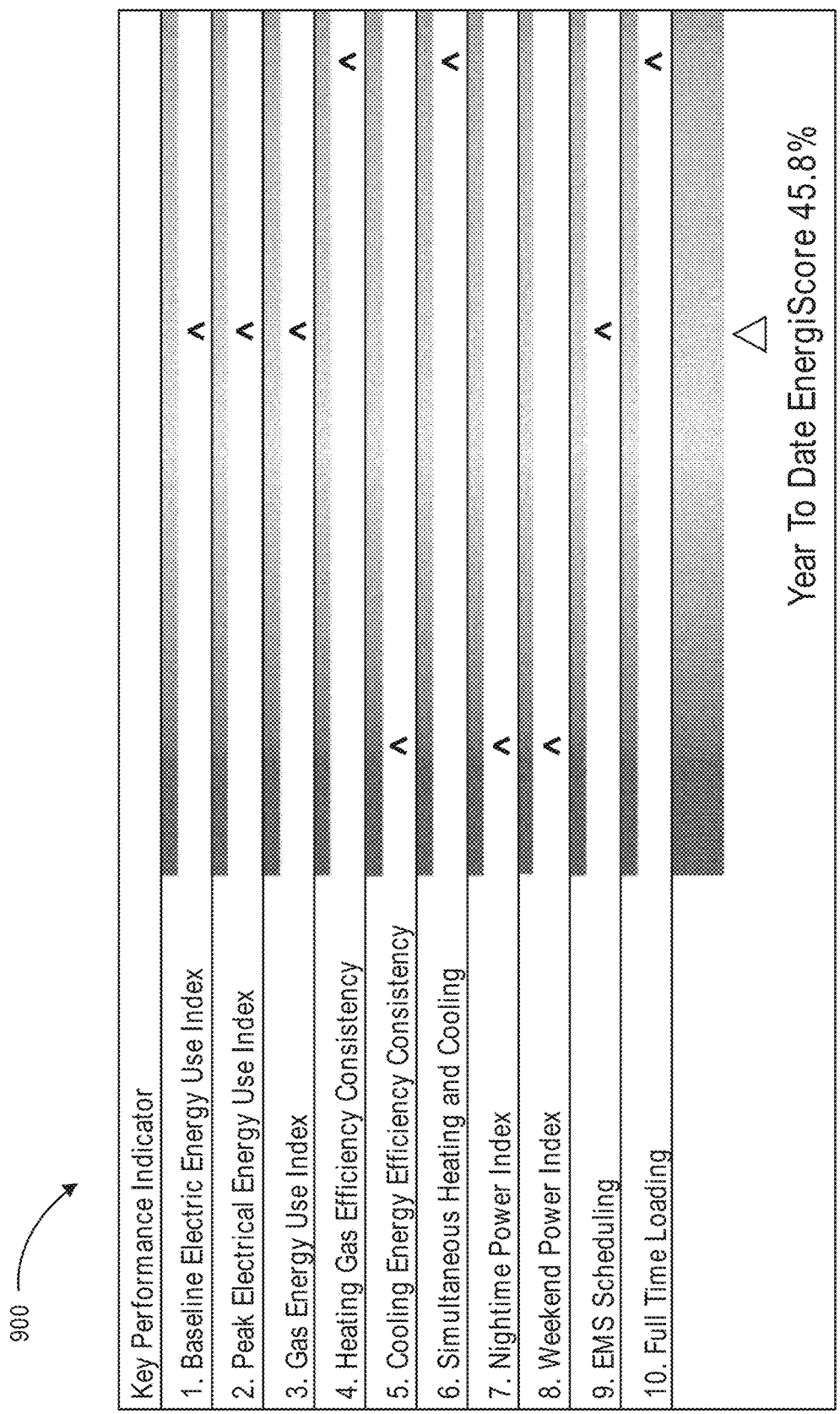
FIG. 9 is an exemplary continuous yearly key performance indicator assessment, according to certain embodiments.
Figure 10:
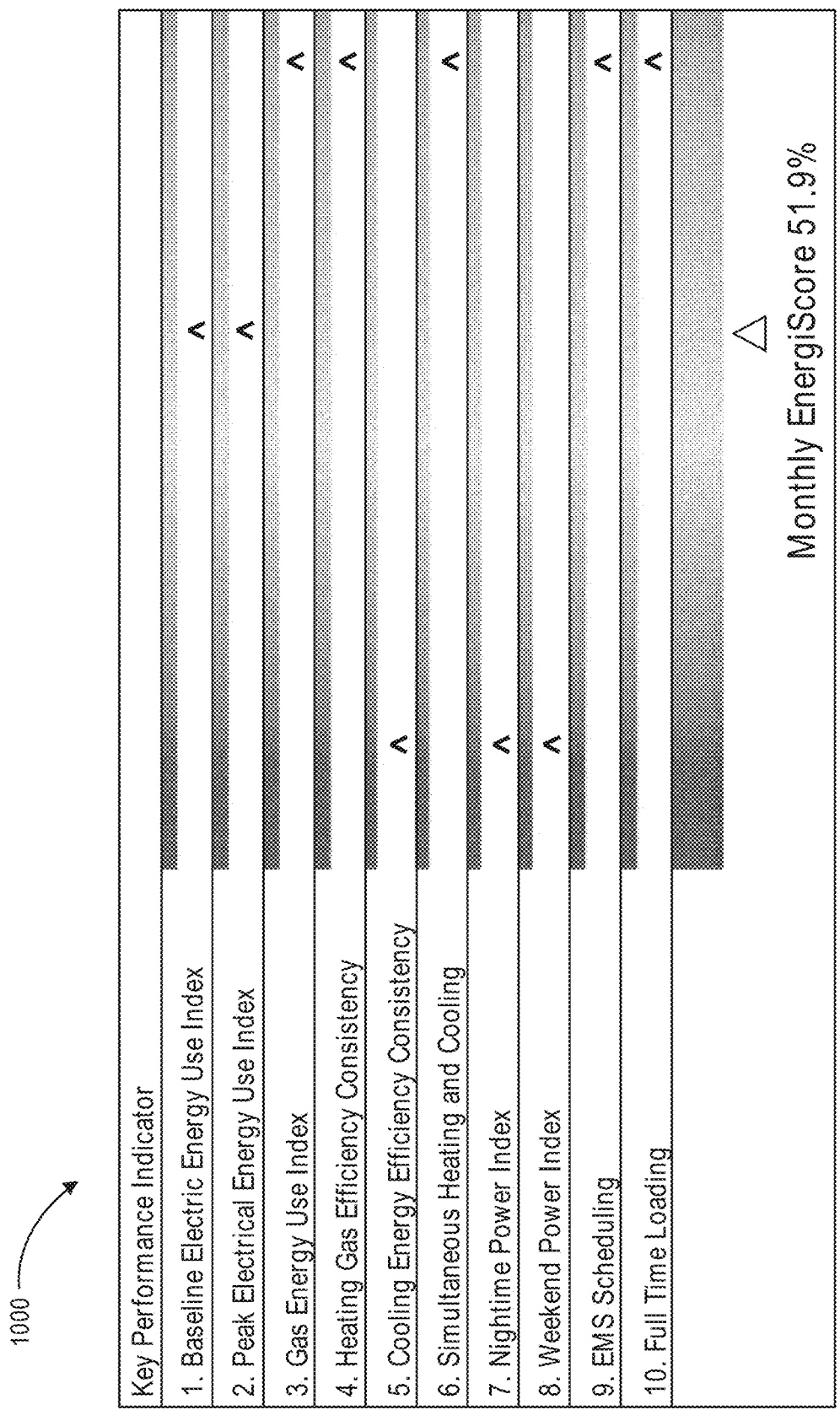
FIG. 10 is an exemplary continuous monthly key performance indicator assessment, according to certain embodiments.

FIG. 9 is an exemplary continuous yearly key performance indicator chart 900 and FIG. 10 is an exemplary continuous monthly key performance indicator chart 1000. Both charts 900 and 1000 track key performance indicators, including but not limited to baseline electric use index, peak electrical energy use index, gas energy use index, heating gas efficiency consistency, simultaneous heating and cooling, nighttime power index, weekend power index, EMS scheduling, and full-time loading, as described above. Chart 900 indicates the year to date energy performance, while chart 1000 indicates the energy performance for a month. In an embodiment, the indicator bars are in color to represent score quality/level where red indicates a poor score, green indicates a good score, and yellow indicates a mediocre score that could be improved.

In an embodiment, one or more alerts are associated with one or more of the metrics. Exceeding, or dropping below a specified metric value and for a specified amount of time will signal an alert and cause an action to be taken. The action may include the closure of relays, a command to be sent via wired or wireless Ethernet®, RF module, machine interface, wired connection, or the like. The action may also include a message to be sent to a computer desktop, a mobile device, a mobile application, a Facebook® page, a Twitter® account, a message board, a broadcast system, or the like.

In an embodiment, one or more alerts are associated with one or more of the metrics. The alerts can be initiated when a metric exceeds or drops below a certain value for a specified amount of time if one or more other metrics, measured variables, such as, for example, temperature, pressure, humidity, flow, current, or the like, estimated variables, calculated variables, and/or any mathematical combination of the metrics and/or variables are at, above, or below a specific value for a specified amount of time, where the specific value can be a function of one or more metrics, measured variables, estimated variables, calculated variables, any mathematical combination of the variables, and/or any mathematical combination of the metrics.

Other embodiments of the energy search engine 102 can report a daily maintenance task list, where the energy search engine 102 generates a list of required maintenance tasks sorted by criticality, energy performance impact, cost performance impact, impact on carbon footprint, cost to fix, and the like. Further, an embodiment of the energy search engine 102 can report equipment diagnostics such that the energy search engine will continuously diagnose and rate the performance of each of the building's equipment 104*a*.

Further embodiments of the energy search engine 102 determines and reports on when and where a building or its energy consuming or energy generating subsystems are operating properly or are in need of maintenance, tuning, load shifting, load shedding, or equipment replacement based at least in part on data level flags that correspond with incremental level changes in energy consumed or generated.

In an embodiment, the energy search engine 102 uses day ahead projected hourly weather data and projected facility schedule and usage to predict energy performance (e.g. kWhr consumption, kW demand, efficiency metrics, etc.) based on a calculated baseline for the facility 104, and correlations of energy baseline with ambient weather, facility schedule and facility usage.

In another embodiment, the energy search engine 102 uses day ahead projected hourly weather data, projected facility schedule, projected facility usage, utility rate information, day ahead utility pricing information, day ahead grid information, day ahead energy cost information, to predict energy cost (kW demand cost, kWhr consumption cost, gas therm cost, water gallons cost, etc.) based on a calculated baseline for the facility 104, and correlations of energy baseline with ambient weather, facility schedule and facility usage.

In yet another embodiment, the energy search engine 102 provides data output that are useful to benchmark and evaluate real property energy consumption and carbon emissions/footprint for purposes that include projecting the value of operational strategies and behaviors or equipment replacements that result in altered real property valuations, and the like.

In yet further embodiments, the energy search engine 102 provides data output that are useful for auditing compliance with existing and emerging legislation on energy use, carbon emissions, and for achieving energy reduction and carbon emission reduction goals at facilities.

Figure 11:
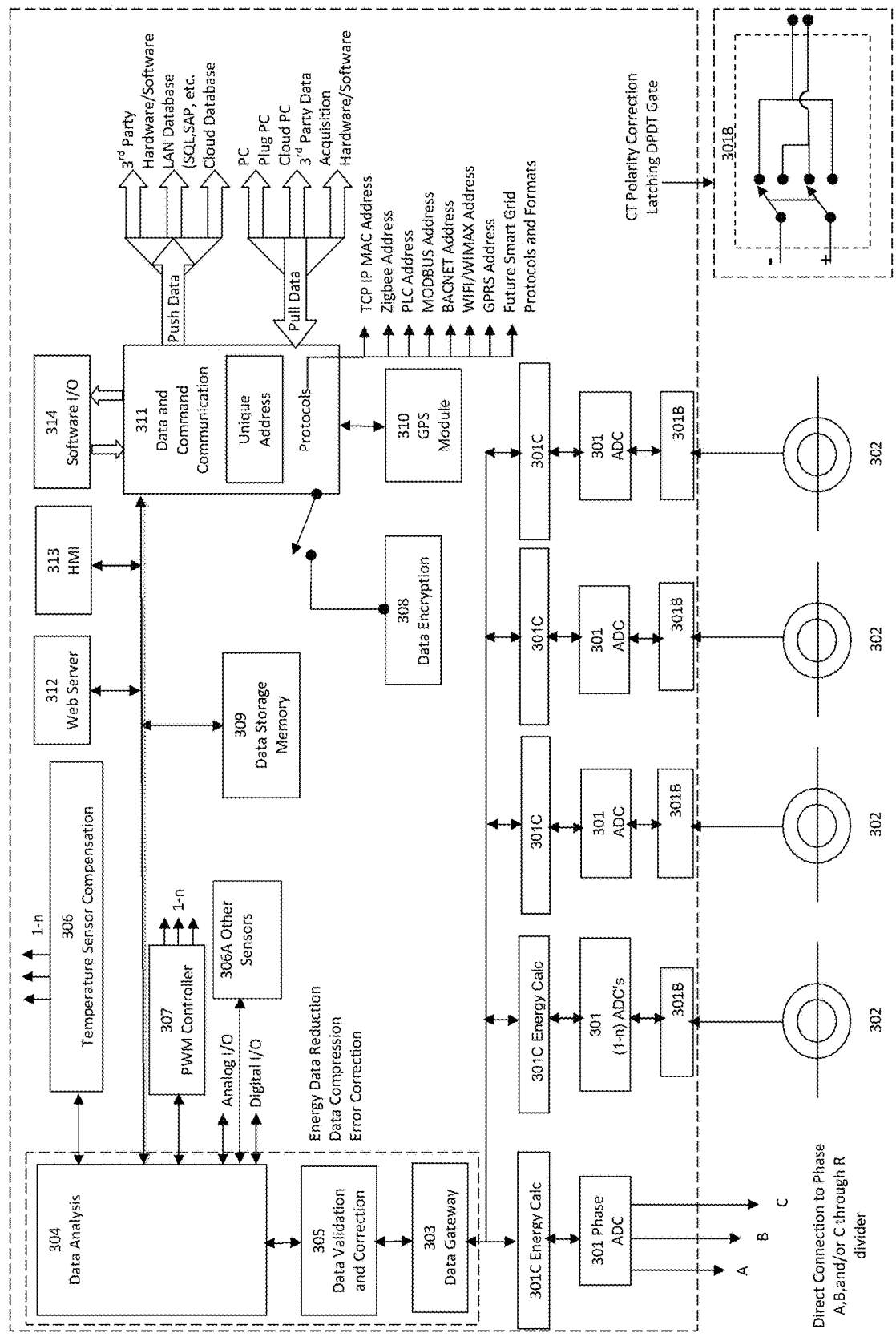
FIG. 11 is an exemplary block diagram of an energy measurement, analysis, communication, and control system, according to certain embodiments.

FIG. 11 illustrates an embodiment of the energy measurement, analysis, communication, and control system. The system comprises Digital Energy Measurement Modules 301, 301B, 301 Phase; Current/power/voltage Measurement Modules 301C for energy calculation or energy data processing; and Modules 303, 304, 305 for enabling energy data quantity reduction and data error correction without compromising the value of the measured data.

The energy data quantity reduction is based, at least in part, on application of an embodiment of the data reduction/data compression technique illustrated in FIG. 4 and filtering parameters, such as change in measured energy (+−x %), rate of change of measured energy (t), and the like.

Data Analysis Module 304 comprises ports where analog I/O analog sensor input and output control signals are exchanged with external sensors, and devices and digital I/O modules where external digital sensor input and control information are exchanged with outside sensors and devices.

Module 306 provides compensated inputs for on-board and/or remote temperature sensors. Module 306A provides inputs from other on-board and/or remote sensors such as pressure sensors, light sensors, acceleration sensors, tensionmeters, flow sensors, gas sensors, microphones, and others.

Module 307 provides PWM controller outputs Class D or Class E PWM control signals for the efficient control of external electric loads through direct connection with high speed electronic switches such as Triac's, MosFets, or IGFET's.

Module 308 enables optional digital data encryption. Module 309 is used for digital data storage. Module 311 provides communications and control commands. Module 310 provides global positioning or location sensing (GPS). Module 312 is a web server and Module 313 provides a human machine interface that can be an LCD display and keypad or keyboard, or the like.

Digital Energy Measurement

Modules 301, 301B, 301 Phase, 301C, and 302 perform digital energy measurement and calculations in electric circuits that are located in any residence, building, commercial or industrial facility, in electric circuits that are used for powering electric powered transportation systems and/or charging electric vehicles, and energy that is provided or delivered by any and all electric generating power systems including solar, wind, fuel cell, micro turbines, or other types of electric generating devices and systems.

Measurement devices 302 are associated with an electrical circuit and acquire an analog measurement of the current, voltage or power in the associated electrical circuit. Measurement devices 302 can be, for example, current transformers (CT) or the like. When current in a circuit is too high to directly apply to measuring instruments, a current transformer 302 produces a reduced current accurately proportional to the current in the circuit, which can be conveniently connected to measuring and recording instruments. The current transformer 302 also isolates the measuring instruments from what may be very high voltage in the monitored circuit.

Current transformers 302 couple to analog to digital converter (ADC) Modules 301 through CT Polarity Correction Modules 301B. Modules 301B comprise a latching double pole double throw gate and permit the automatic correction for the polarity of the measured current, should the current transformer 302 be incorrectly installed. The position of latching DPDT gate in Module 301B is determined by algorithms that operate on Modules 305 and 306 to evaluate when the voltage phase from Phase ADC Module 301 and the current phase from Module 301 of a given measurement circuit are separated by more than approximately 90 degrees and less than approximately 270 degrees. When this condition exists, the CT 302 polarity is deemed incorrect and the position of latching DPDT gate is switched to the alternate position.

Other examples of measurement devices 302 are Rogowski coils, DC shunts, external digital current sensors, and external analog current sensors. In one embodiment, the system provides for the intermixed use of clamp on current measuring toroid transformers (CTs), Rogowski coils, DC shunts, or other current measuring devices.

ADC Modules 301 convert the analog measurement from the measurement devices 302 into a digital measurement for use in the system. ADC Modules 301 comprise an analog to digital converter, and at least one jumper. In one embodiment, the analog to digital converter is an Analog Devices IC, part number ADC 5169, or the like.

In an embodiment, the jumper configuration of the ADC Module 301 is field selectable for the accurate measurement of 1 to n electric circuit phase configurations including single phase, split phase, three phase Delta, and three phase Wye. Phase configuration and association of the ADC module with its respective voltage phase can also be done in software in another embodiment.

Phase ADC Module 301 couples to energized circuits with phase A, B, and/or C through resistive voltage dividers to digitally measure voltage amplitude and phase information.

The digital measurement information collected by the Phase ADC Module 301 and the ADC Modules 301 for 1 to n measured electrical circuits is sent to the Energy Calculation Module 301C. The data sample rate ranges between approximately 10 samples/second to approximately 24 kilo samples/second.

Data reduction processes comprises Modules 303, 304, and 305 utilizing an embodiment of the data reduction/data compression technique illustrated in FIG. 4 to substantially reduce the quantity of measured energy data that will be reported in real time, stored in memory data, or "pushed" to remote or cloud data base or "pulled" from a user inquiry. The reduced quantity of energy data is based on previously defined or user defined data filtering parameters such as amount of change or rate of change of measured or calculated energy data. The energy or environmental data quantity reduction technique that is shown in embodiments is broadly applicable to any energy or environmental device or network of devices. Module 303 samples the measured and calculated energy data from 1 to n ADCs at frequencies up to approximately 24,000 samples per second and sends the data to the Data Validation and Correction Module 305 for determination of data accuracy. Module 304 analyses the energy data and also receives input from other internal and external sensors, Modules 306 and 306A. The Analysis Module 304 also contains algorithm for reducing the number of points passed from Module 305 and sends the formatted and substantially reduced quantity of measurement data to at least Modules 311, 312, 313 and 309. Based on comparison of this measured energy data and input from external environmental sensors, a control signal is sent to external devices for load control through the Analog I/O, Digital I/O, or PWM Controller Module 307.

Digital Data Analysis with Automated Error Correction

Data Validation and Correction Module 305 and Data Analysis Module 304 for 1-n electric circuits provide real time digital analysis, validation, and auto correction of measured energy use and the quality of energy that is available at a power generating system that is found on the grid, smart grid, micro grid, residence, building, commercial facility, or for electric vehicle and electric powered transportation systems, according to certain embodiments. Embodiments include electrical circuits powered by solar, wind, fuel cells, and any type of electric energy generator.

In one embodiment, Module 305 generates signals to control the Data Analysis Module 304 when the voltage phase and the current phase of a given ADC Module 301 exhibits more than approximately 90 degrees and less than approximately 270 degrees of phase differential. Software used by the Data Analysis Module 305 automatically identifies the correct phase that is associated with ADC Module 301 and attaches this phase information to the correct energy information from ADC Module 301 in the Data Validation and Error Correction Module 305.

In an embodiment, Module 306 does not configure the ADC Module 301. Instead the output data from a specific ADC Module 301 is correctly attached to the correct phase data (A, B, C, . . . , n) from Phase ADC Module 301 in Module 305.

In one embodiment, Data Validation and Correction Module 305 analyzes energy spikes to determine whether the spike is valid or is noise or corrupted data by acquiring additional samples at approximately the same time as the energy spike from Module 303 which provides a data gateway. If the energy spike is a valid data measurement, the amplitude of the later acquired sample will be proportional to the energy spike. If the amplitude of the later acquired data is substantially different than the energy spike, Module 305 determines that the energy spike was caused by noise, and treats the bad data as irrelevant and not worthy of being passed on for storage or "push" or "pull" communication.

Data Analysis Module 304 processes measured energy data and compares it with external environmental and facility use information to derive and deliver electric load, device, and BMS/EMS control signals that are used to reduce or increase the electric energy in a specific circuit. Data Error Correction Module 305 processes measured energy data and compares it with prior data samples to insure that only relevant and accurate data is passed from Data Gateway Module 303 to the Communication Module 311 or to I/Os or to PWM Controller Module 307.

Digital Data Encryption

Data Encryption Module 308 optionally encrypts the data that is derived from the measuring of all electric circuits and the location of circuits and measurement apparatus using secure and anti-hacking data encryption algorithms. Module 308 can also be positioned just downstream of Module 304. In one embodiment, the Data Encryption Module 308 uses anti tamper and anti-hacking handshaking through the use of existing and emerging "smart grid" security data protocols.

Digital Data Storage

Data Storage Memory Module 309 stores the measured and digitized electric circuit data and measured electric energy quality data. In an embodiment, the Data Storage Memory Module 309 provides a data buffer in case communication channel with the local or remote host is broken. The buffer decouples data sampling rates and data reporting rates. The data is stored locally at the required sampling rate until the communication lines are re-established. The data is then transferred to the host ensuring no data loss during communication breakdown.

Universally Interoperable Communications and Control

Data Command and Communication Module 311 provides the system with a unique address. Module 311, in one embodiment, can push data to and/or pull data from 3rd party hardware or software including but not limited to structured query language (SQL) and/or SAP databases, Cloud based databases, and/or any type of computing device.

Data Command and Communication Module 311 pushes digitally measured electric circuit energy use data from 1-n circuits using protocols, such as, for example, Ethernet, ZigBee, PLC (Power Line Carrier), WiFi, WiMax, GSM to a remote device for real time analysis, for real time analysis and control, and/or to a remote structured query language (SQL), SAP, or cloud data base for storage, comparison of data, data mining, and data analysis for a multiplicity of purposes including billing and control of circuit circuits, smart appliances, electric vehicle and electric transportation systems. The data can be delivered in XML, JSON, CSV, ASCII Strings, Binary Strings, and other formats.

In an embodiment, the Data Command and Communication Module 311 uses data clock synchronization and system clocking via Ethernet connection. Other system connections include networked TCP/IP, client-server ModBus, BacNet, mesh network ZigBee wireless, WiFi, and WiMax that are operating either individually or concurrently to interact with 3rd party hardware and software.

The Data Command and Communication Module 311 can simultaneously retain a copy of the measured data in onboard memory so that it can be viewed and accessed through the web server, according to certain embodiments.

In one embodiment, the Data Command and Communication Module 311 can also act as a slave to the acquisition host, such as a PC or the like, and communicate with the master host in one of several standard protocols, such as Ethernet protocols including ModBus and BacNet, for example. The Module 311 then acts as a translation of the protocol to serial communication.

The software Digital I/O module and Analog I/O module interfaces with the Data and Command Communication Module 311 and with the Data Analysis Module 304 to enable two-way software commands and interrupts to be exchanged between the Data Analysis Module 304 and other BMS, BEMS, electrical vehicle charge stations, motor control systems, electrical control systems, smart appliances, programmable logic controllers, and the like.

In an embodiment, the Temperature Sensor Compensation Module 306 comprises calibration compensation look up tables to correctly utilize J or K thermocouple devices or wired or wireless thermostats for external local or remote measurement of temperature.

The PWM Controller Module 307 is directed either by the Data Analysis Module 306 or the Communication and Command Module 311 to output a signal that consists of variable duty cycle pulses for load control through external high speed electronic switches such as high power MOSFETS, IGFETs, or other high speed electronic switching devices. Such variable width pulses enable an external high speed electronic switch to control the electric energy and carbon footprint of any electric circuit or device including lighting circuits, motor circuits, air handling systems, HVAC compressor systems, and the like. This embodiment when combined with an external high speed electronic switch refers to a Class D or Class E control system design.

The GPS Location Information Module 310 interfaces with the Data and Command Communication Module 311 and maps the location of each identified circuit board that has a unique MAC address.

Universally Interoperable Control

In an embodiment, Analog/digital input/output I/O modules interface external sensors with the Data Analysis Module 304 and the Data Command and Communication Module 311. Sensors, such as, for example, temperature sensors, humidity sensors, light sensors, occupancy sensors, motion sensors, acceleration sensors, vibration sensors, flow sensors, wind speed, heat sensors, gas sensors, gas spectrometers, laser sensors, humidity sensors, and other environmental sensors such as water flow, air flow, and gas flow provide data, including environmental, fuel type, or other data, to the Module 304 or 311 where the data is analyzed to calculate energy loads, determine possible energy reduction, identify malfunctioning systems, and/or the like.

Data Command and Communication Module 311 implements predetermined and automated power reduction steps in energy use systems, smart appliances, or plug loads, based at least in part on the sensor data or on external demand response commands, according to certain embodiments.

Further, in an embodiment, the analog/digital I/O module interfaces with analog sensor input or digital input, analog or digital control circuit input, and output circuits for localized or remote control of relays, switches, programmable logic controllers, Building Management Systems (BMS), Building Energy Management Systems (BEMS), energy management and carbon footprint reporting systems, or the like. In another embodiment, the analog/digital I/O module interfaces with pulse counters from natural gas or water meters to integrate this additional data.

Customer Engagement

Web server 312 and Human Machine Interface (HMI) 313 provide the user with a Web-based user interface to the system of FIG. 11. Examples of HMI 313 are 8, 16, or more segment LEDs or LCD panels, Keypads, Qwerty keyboards, and the like. Embodiments provide user interface software that is accessible via Ethernet from personal computers (PCs) on the local area or wide area network.

In one embodiment, the user interface allows the user to define the grouping of circuits to be measured and the locations for the circuits to be measured. The system provides users with "drag and drop" functionality of circuits between groups and locations and "drag and drop" functionality for charting and reporting in a mobile app. Users can also, in one embodiment, view real time or stored and "pushed" or "pulled" energy use on Mobile platforms, such as for example, I-Phone, Android, BlackBerry, and the like.

The user can define minimum and maximum alert thresholds on all measured and calculated metrics, such as, voltage, current, energies, energy consumption rate, powers, power factor, cost, cost rate, energy efficiency metric, energy efficiency rating, and the like, for each circuit, group of circuits and location. Comparative alert thresholds are used on metrics and for circuits where alerts are triggered by relative energy signature of circuits, groups and locations with each other or with established baselines or benchmarks. Predictive alert thresholds are used on metrics and for circuits where alerts are triggered by projected energy consumption of a circuit, group or location. When an alert is triggered, the system provides the user with an alert through email, text message, Facebook, Twitter, voicemail, RSS feeds, multi-media message automatic alerts, and the like. In one embodiment, the alert is accompanied by a description of the trigger event including charts and reports on history before alert trigger and projected consumption and results.

In another embodiment, through the Web Server 312 or the push capability, the user is provided with animated and interactive desktop and mobile widgets for communicating energy consumption levels, energy ratings and critical energy conservation measures to end users. In another embodiment, the system communicates energy consumption levels, energy ratings and critical energy conservation measures to end users through RSS feeds with desktop tickers.

Other embodiments determine the need for air or fluid filter replacement, belt tension, belt alignment, worn or damaged bearings, worn or damaged gears, poor lubrication, damaged anchor or frame, damaged or worn brushes, unbalanced voltage, poor power quality, and the like based on the electrical signature. In an embodiment, the electrical signature comprises at least one of a current and/or voltage waveform, current and/or voltage levels and peaks, power factor, other sensor information, such as temperature, vibration, acceleration, rotation, speed, and the like, of any "downstream" motor or pump.

An embodiment of the algorithm for Energy Data Reduction relates to bandwidth issues that will be encountered on the 'smart grid" just as MPEG did for audio and video. With a plethora of measurement and reporting systems running at high speed, data collection will overload a network with data. Use of this technique or method on any chip, device, circuit or computer will reduce the communication bandwidth and processing requirements of said devices.

In other embodiments, the energy search engine 102 provides preplanned or instant actionable energy optimization strategies through activation of systems and circuits that shed and/or shift energy consumption and/or provide supplemental energy resources. The energy search engine 102 can provide data output to Energy Management Systems (EMS) and/or Building Management Systems (BMS) and/or load control relays to respond with either instant or preprogrammed load shedding strategies, load shifting strategies, and supplemental energy supply strategies, according to certain embodiments.

Depending on the embodiment, certain acts, events, or functions of any of the algorithms described herein can be performed in a different sequence, can be added, merged, or left out altogether (e.g., not all described acts or events are necessary for the practice of the algorithm). Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a general purpose processor, a digital signal processor (DSP), an ASIC, a FPGA or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The steps of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable storage medium known in the art. An exemplary storage medium can be coupled to the processor such that the processor can read information from, and write information to, the storage medium. In the alternative, the storage medium can be integral to the processor. The processor and the storage medium can reside in an ASIC.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "proportional to", as generally used herein, refer to being based at least in part on. The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method to dynamically assess and control energy efficiency of a fan installed in a facility that includes installed building systems, subsystems, and components, the method comprising:
   obtaining, with computer hardware including at least one computer processor and computer-readable storage, a minimum energy consumption of the fan wherein obtaining the minimum energy consumption comprises:
   obtaining a theoretical minimum energy consumption of the fan based at least in part on theoretical efficiency limits of the fan;
   obtaining an achievable energy consumption of the fan based at least in part on specifications associated with high energy-efficiency equivalents of the fan; and
   obtaining a designed minimum energy consumption of the fan based at least in part on specifications associated with the installed fan;
   receiving, at least once a minute, a measurement of an actual energy consumption of one or more of the fan, installed building systems, subsystems, and components, wherein receiving the measurement of the actual energy consumption comprises:
   receiving, with a first analog input/output module, first data associated with the one or more of the fan, installed building systems, subsystems and components, the first data having a first protocol;
   receiving, with a second analog input/output module, second data associated with the one or more of the fan, installed building systems, subsystems and components, the second data having a second protocol different from the first protocol;
   sampling, at least once a minute, the first and second data to provide first and second digital data; and
   transmitting at least one of the first and second digital data over a network having a protocol different from the first and second protocols; and
   comparing, with the computer hardware, the minimum energy consumption to the measurement of the actual energy consumption to calculate an energy performance assessment that is based on theoretical, achievable, and designed energy efficiencies of the fan, wherein comparing the minimum energy consumption to the measurement of the actual energy consumption comprises:
   comparing, at least once a minute, the theoretical minimum energy consumption to the measurement of the actual energy consumption to determine the theoretical energy efficiency;
   comparing, at least once a minute, the achievable minimum energy consumption to the measurement of the actual energy consumption to determine the achievable energy efficiency; and
   comparing, at least once a minute, the designed minimum energy consumption to the measurement of the actual energy consumption to determine the designed energy efficiency.

2. The method of claim 1 wherein the first data and the second data comprise one or more of fan upstream pressure, fan downstream pressure, flow temperature, fan speed, mass flow rate through the fan, volumetric flow rate through the fan, and/or energy consumed by the fan.

3. The method of claim 1 wherein the installed building systems, subsystems, and components comprise at least one of a chiller, HVAC system, pump, a cooling tower, a valve, and a water heating system.

4. The method of claim 1 further comprising using a library of models of installed building systems to determine the designed minimum energy consumption.

5. The method of claim 1 wherein the fan further comprises a roof top packaged unit.

6. The method of claim 1 further comprising calculating a score based at least in part on an energy performance of the fan, the score being a weighted average of the theoretical, achievable, and designed energy efficiencies.

7. The method of claim 1 further comprising transmitting control commands to the one or more of the fan, installed building systems, subsystems, and components based at least in part on the energy performance assessment, wherein the transmitting the control commands comprises:
  transmitting, with the first analog input/output module, a first control command associated with the one or more of the fan, installed building systems, subsystems and components, the first control command having the first protocol; and
  transmitting, with the second analog input/output module, a second control command associated with the one or more of the fan, installed building systems, subsystems and components, the second control command having the second protocol.

8. The method of claim 1 further comprising receiving information from a building management system associated with the facility, wherein the information comprises one or more of weather information, grid information, and utility information.

9. The method of claim 1 further comprising receiving information from a cloud computer, wherein the information comprises one or more of weather information, grid information, and utility information.

10. The method of claim 1 wherein the computer hardware is the fan controller.

11. An apparatus to dynamically assess energy usage of a fan installed in a facility, the apparatus comprising:
  an energy management system including at least one computer processor, the energy management system configured to obtain a minimum energy consumption of the fan and the facility that includes installed building systems, subsystems, and components, wherein obtaining the minimum energy consumption comprises:
  obtaining, with the at least one computer processor, a theoretical minimum energy consumption of the fan based at least in part on theoretical efficiency limits of the fan;
  obtaining, with the at least one computer processor, an achievable energy consumption of the fan based at least in part on specifications associated with high energy-efficiency equivalents of the fan; and
  obtaining, with the at least one computer processor, a designed minimum energy consumption of the fan based at least in part on specifications associated with the fan;
  a plurality of measurement devices configured to measure, at least once a minute, an actual energy consumption of one or more of the fan, installed building systems, subsystems, and components;
  the energy management system including a first analog input/output module and a second analog input/output module, the energy management system further configured to receive the measurement of the actual energy consumption of the one or more of the fan, installed building systems, subsystems and components, wherein receiving the measurement of the actual energy consumption comprises:
  receiving, with the first analog input/output module, first data associated with the one or more of the fan, installed building systems, subsystems and components, the first data having a first protocol;
  receiving, with the second analog input/output module, second data associated with the one or more of the fan, installed building systems, subsystems and components, the second data having a second protocol different from the first protocol;
  sampling, at least once a minute, the first and second data to provide first and second digital data; and
  transmitting at least one of the first and second digital data over a network having a protocol different from the first and second protocols; and
  the energy management system further configured to compare, with the at least one computer processor, the minimum energy consumption to the measurement of the actual energy consumption to calculate an energy performance assessment that is based on theoretical, achievable, and designed energy efficiencies of the fan, wherein comparing the minimum energy consumption to the measurement of the actual energy consumption comprises:
  comparing, at least once a minute, the theoretical minimum energy consumption of the fan to the measurement of the actual energy consumption to determine the theoretical energy efficiency;
  comparing, at least once a minute, the achievable minimum energy consumption of the fan to the measurement of the actual energy consumption to determine the achievable energy efficiency; and
  comparing, at least once a minute, the designed minimum energy consumption of the fan to the measurement of the actual energy consumption to determine the designed energy efficiency.

12. The apparatus of claim 11 wherein the facility further includes at least one of a building, a building envelope, an energy subsystem, a zone within the building, and a data center.

13. The apparatus of claim 11 wherein the energy performance assessment further comprises at least one of a gas energy carbon footprint, an electrical energy carbon footprint, an estimate of wasted energy, an energy rating, and a power index.

14. The apparatus of claim 11 wherein the first data and the second data comprise one or more of fan upstream pressure, fan downstream pressure, flow temperature, fan speed, mass flow rate through the fan, volumetric flow rate through the fan, and/or energy consumed by the fan.

15. The apparatus of claim 11 wherein the energy management system is further configured to calculate a score based at least in part on an energy performance of the fan, the score being a weighted average of the theoretical, achievable, and designed energy efficiencies.

16. The apparatus of claim 11 wherein the designed minimum energy consumption is further based at least in part on a library of models of the installed building systems.

17. The apparatus of claim 11 wherein the energy management system is further configured to receive grid and utility information.

18. The apparatus of claim 11 wherein the energy management system is further configured to receive measurements of ambient conditions associated with the fan.

19. The apparatus of claim 18 wherein the measurements of the ambient conditions comprises one or more of weather reports, outside air temperature, outside air humidity, cloud coverage, UV index, precipitation level, evaporative transpiration (ET) number, and weather forecasts.

20. The apparatus of claim 11 wherein the energy management system is further configured to transmit control commands based at least in part on the energy performance assessment, wherein transmitting the control commands comprises:
   transmitting, with the first analog input/output module, a first control command associated with the one or more of the fan, installed building systems, subsystems and components, the first control command having the first protocol; and
   transmitting, with the second analog input/output module, a second control command associated with the one or more of the fan, installed building systems, subsystems and components, the second control command having the second protocol.

* * * * *